(12) United States Patent
Kim et al.

(10) Patent No.: US 11,817,458 B2
(45) Date of Patent: Nov. 14, 2023

(54) DISPLAY DEVICE

(71) Applicant: Samsung Display Co., Ltd., Yongin-si (KR)

(72) Inventors: Ki Hyun Kim, Hwaseong-si (KR); Young Gil Park, Anyang-si (KR); Jin Suk Lee, Gwangmyeong-si (KR); Jai Sun Kyoung, Cheonan-si (KR); Sug Woo Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 441 days.

(21) Appl. No.: 16/935,063

(22) Filed: Jul. 21, 2020

(65) Prior Publication Data
US 2021/0175258 A1 Jun. 10, 2021

(30) Foreign Application Priority Data
Dec. 4, 2019 (KR) .................. 10-2019-0159525

(51) Int. Cl.
*H01L 27/12* (2006.01)
*H10K 59/121* (2023.01)

(52) U.S. Cl.
CPC ...... *H01L 27/1218* (2013.01); *H01L 27/1225* (2013.01); *H01L 27/1248* (2013.01)

(58) Field of Classification Search
CPC ... H01L 27/1218; H01L 27/32; H01L 27/322; H01L 51/5253; H01L 27/1248; H01L 27/1225
See application file for complete search history.

(56) References Cited

U.S. PATENT DOCUMENTS

| | | | |
|---|---|---|---|
| 2009/0115029 A1* | 5/2009 | Koyama | H01L 21/76254 438/164 |
| 2017/0033226 A1* | 2/2017 | Yamazaki | H01L 21/8258 |
| 2018/0224574 A1* | 8/2018 | Lee | C23C 14/0617 |
| 2018/0269355 A1* | 9/2018 | Jain | H01L 33/145 |
| 2018/0286915 A1* | 10/2018 | Yeon | H01L 33/38 |
| 2019/0187850 A1* | 6/2019 | Kim | G06F 3/0445 |

(Continued)

FOREIGN PATENT DOCUMENTS

| | | |
|---|---|---|
| JP | 2002-222959 A | 8/2002 |
| KR | 2001-0066251 A | 7/2001 |
| KR | 10-2007-0021747 A | 2/2007 |

(Continued)

OTHER PUBLICATIONS

Choo et al., English Machine translated of KR Publication No. 20170059502, May 31, 2017.*

(Continued)

*Primary Examiner* — Mohsen Ahmadi
(74) *Attorney, Agent, or Firm* — Lewis Roca Rothgerber Christie LLP

(57) ABSTRACT

A display device includes: a substrate; a polycrystalline silicon film on the substrate; and a first buffer film between the substrate and the polycrystalline silicon film and having one surface contacting the polycrystalline silicon film and another surface opposite to the one surface, wherein the one surface of the first buffer film has a first root mean square (RMS) roughness range, and the first RMS roughness range is 1.5 nm or less.

20 Claims, 20 Drawing Sheets
(5 of 20 Drawing Sheet(s) Filed in Color)

(56) References Cited

U.S. PATENT DOCUMENTS

2020/0210006 A1* 7/2020 Son .................. H01L 27/323
2021/0034180 A1* 2/2021 Hirotsugu ............... G06F 3/046

FOREIGN PATENT DOCUMENTS

| KR | 10-2007-0097442 A | 10/2007 |
| KR | 10-2016-0116039 A | 10/2016 |
| KR | 10-2017-0059502 A | 5/2017 |

OTHER PUBLICATIONS

Lim et al., English Machine translated of KR Publication No. 20160072946, Jun. 6, 2016.*

* cited by examiner

FIG. 12

| Area | Before roughness improvement | After roughness improvement |
|---|---|---|
| | Interface / In-film | Interface / In-film |
| As-depo | 1.5 | 2.0 |
| Dehydrogen | 3.5 | 11.3 |
| ELA | 76.5 | 495.6 |

FIG. 13

| H concentration | Before roughness improvement | After roughness improvement |
|---|---|---|
| | Ratio | Ratio |
| | Interface / In-film | Interface / In-film |
| As-depo | 1.8 | 3.9 |
| Dehydrogen | 4.8 | 23.9 |
| ELA | 180.8 | 1238.0 |

FIG. 15

| Image | {100} fraction | {101} fraction | {111} fraction |
|---|---|---|---|
| Before roughness improvement | 21.20 % | 8.59 % | 0.24 % |
| After roughness improvement | 4.48 % | 16.06 % | 1.43 % |

DISPLAY DEVICE

CROSS-REFERENCE TO RELATED APPLICATION

This application claims priority to and the benefit of Korean Patent Application No. 10-2019-0159525, filed on Dec. 4, 2019, in the Korean Intellectual Property Office, the entire disclosure of which is hereby incorporated by reference.

BACKGROUND

1. Field

The present disclosure relates to a display device.

2. Description of the Related Art

With the development of information society, requirements for display devices for displaying images have increased in various forms. Accordingly, in recent years, display devices include liquid crystal display (LCD), plasma display panel (PDP), organic light emitting display (OLED), and micro light emitting diode display.

A display device includes a light emitting diode and a plurality of thin film transistors connected to the light emitting diode. Each of the thin film transistors may include a channel region and source/drain regions, which are formed of a polycrystalline silicon film.

When a thin film transistor is turned on in an operating voltage range, current flow is formed by the thin film transistor, and when the thin film transistor is turn off in a non-operating range again, the current flow is controlled by the thin film transistor.

Meanwhile, device characteristics of the thin film transistor may be changed depending on the crystal direction, crystal size and crystal defect of the polycrystalline silicon film providing the channel region and source/drain regions of the thin film transistor.

SUMMARY

An embodiment of the present disclosure is directed toward a display device including thin film transistors having improved device characteristics.

According to an embodiment, a display device includes a substrate; a polycrystalline silicon film on the substrate; and a first buffer film between the substrate and the polycrystalline silicon film and having one surface contacting the polycrystalline silicon film and another surface opposite to the one surface, wherein the one surface of the first buffer film has a first root mean square (RMS) roughness range, and the first RMS roughness range is 1.5 nm or less.

The first buffer film may include a silicon oxide film.

The display device may further include: a second buffer film between the substrate and the first buffer film, wherein the second buffer film includes a different material than the first buffer film (e.g., the second buffer film is different in material than the first buffer film).

The second buffer film may include a silicon nitride film.

The polycrystalline silicon film may have one surface contacting the one surface of the first buffer film, and another surface opposite to the one surface of the polycrystalline silicon film; and the one surface of the polycrystalline silicon film may have a second RMS roughness range, and the second RMS roughness range may be equal to the first RMS roughness range.

The other surface of the polycrystalline silicon film may have a third RMS roughness range, and the third RMS roughness range may be greater than the second RMS roughness range.

The polycrystalline silicon film may have one surface contacting the one surface of the first buffer film, and another surface opposite to the one surface of the polycrystalline silicon film; and the polycrystalline silicon film may include hydrogen ions, and an average concentration of the hydrogen ions in a vicinity of the one surface of the polycrystalline silicon film may be greater than an average concentration of the hydrogen ions in a vicinity of a center of the polycrystalline silicon film (e.g., the vicinity of the one surface of the polycrystalline silicon film is greater in average concentration of the hydrogen ions than the vicinity of the center of the polycrystalline silicon film).

The vicinity of the one surface of the polycrystalline silicon film may be defined as a first region which is a section of the polycrystalline silicon film extending from the one surface of the polycrystalline silicon film toward the other surface of the polycrystalline silicon film by a depth of 100 Å, and the vicinity of the center of the polycrystalline silicon film may be defined as a second region which is a section of the polycrystalline silicon film extending from a center point of the polycrystalline silicon film toward the one surface of the polycrystalline silicon film by a depth of 50 Å and extending from the center point of the polycrystalline silicon film toward the other surface of the polycrystalline silicon film by a depth of 50 Å.

The average concentration of the hydrogen ions in the first region may be 100 times or more the average concentration of the hydrogen ions in the second region.

The hydrogen ions of the polycrystalline silicon film may be provided from the first buffer film.

The concentration of the hydrogen ions at the one surface of the polycrystalline silicon film may be 200 times or more the concentration of the hydrogen ions at the center point of the polycrystalline silicon film.

Among crystals of the polycrystalline silicon film, a ratio of the number of first crystals having a {100} plane to the number of all crystals may be 20% or more.

Among the crystals of the polycrystalline silicon film, a ratio of the number of first crystals to the sum of the number of the first crystals, the number of second crystals having a {101} plane, and the number of third crystals having a {111} plane may be 70% or more.

The polycrystalline silicon film may have an average crystal size of 350 nm.

The number of defects in the polycrystalline silicon film may be $1\times10^{17}$ (spins/cm$^3$).

The first RMS roughness range may be calculated by measuring 20 points spaced apart at 25 nm regulars in a region having a length of 500 nm, and the first RMS roughness may be measured using a TEM or an atomic microscope (atomic force microscopy (AFM)).

According to another embodiment, a display device includes a substrate; a polycrystalline silicon film on the substrate; and a first buffer film between the substrate and the polycrystalline silicon film and having one surface contacting the polycrystalline silicon film and another surface opposite to the one surface, wherein the one surface of the first buffer film has a first root mean square (RMS) roughness range, and the first RMS roughness range is 1.5 nm or less, and among crystals of the polycrystalline silicon film, a ratio of the number of first crystals having a {100} plane direction to the number of all crystals is 20% or more.

The first RMS roughness range may be calculated by measuring 20 points spaced apart at 25 nm regulars in a region having a length of 500 nm, and the first RMS roughness range may be measured utilizing an atomic microscope.

The polycrystalline silicon film may have one surface contacting the one surface of the first buffer film, and another surface opposite to the one surface of the polycrystalline silicon film, the one surface of the polycrystalline silicon film may have a second RMS roughness range, the second RMS roughness range may be equal to the first RMS roughness range, the other surface of the polycrystalline silicon film may have a third RMS roughness range, and the third RMS roughness range may be greater than the second RMS roughness range.

Among the crystals of the polycrystalline silicon film, the ratio of the number of the first crystals to the sum of the number of the first crystals, the number of second crystals having a {101} plane direction, and the number of third crystals having a {111} plane direction may be 70% or more.

However, aspects and features of the present disclosure are not restricted to the one set forth herein. The above and other aspects and features of the present disclosure will become more apparent to one of ordinary skill in the art to which the present disclosure pertains by referencing the detailed description of the present disclosure given below.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects and features of the present disclosure will become more apparent by describing in more detail example embodiments thereof with reference to the attached drawings, in which:

FIG. 12 is a table showing the hydrogen ion concentration areas inside the polycrystalline silicon film and at the interface of the polycrystalline silicon film with the second buffer polycrystalline silicon film;

FIG. 13 is a table showing the hydrogen ion concentrations inside the polycrystalline silicon film and at the interface of the polycrystalline silicon film with the second buffer film;

FIG. 15 is another view for comparing a polycrystalline silicon film according to an embodiment and a polycrystalline silicon film according to Comparative Example;

DETAILED DESCRIPTION

Figure 1:
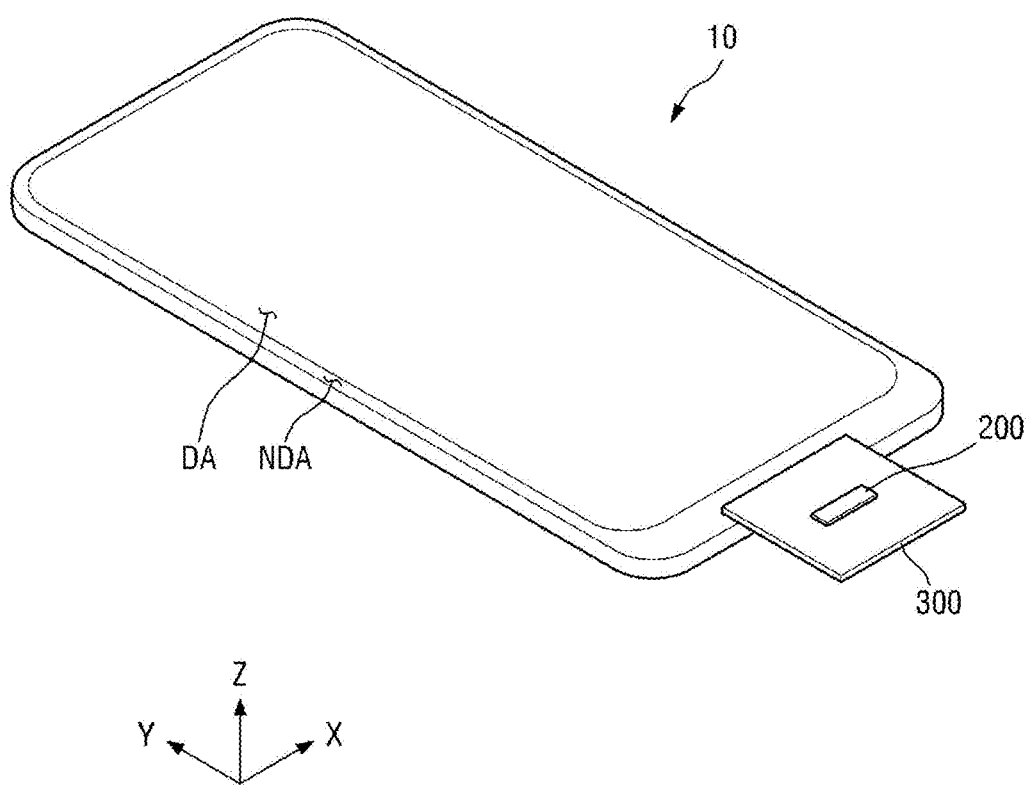
FIG. 1 is a perspective view of a display device according to an embodiment.

Disclosed structural and functional descriptions of embodiments of the present disclosure disclosed herein are only for illustrative purposes of the embodiments of the present disclosure. The present disclosure may be embodied in many different forms without departing from the spirit and significant characteristics of the present disclosure. Therefore, the embodiments of the present disclosure are disclosed only for illustrative purposes and should not be construed as limiting the present disclosure. The present disclosure is defined by the scope of the claims and equivalents thereof.

It will be understood that when an element is referred to as being related to another element, such as being "coupled" or "connected" to another element, it can be directly coupled or connected to the other element or intervening element(s) may be present therebetween. In contrast, it should be understood that when an element is referred to as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the spirit and scope of the present disclosure.

The terminology used herein is for the purpose of describing some of the disclosed embodiments only and is not intended to be limiting. As used herein, "a", "an," "the," and "at least one" do not denote a limitation of quantity, and are intended to include both the singular and plural, unless the context clearly indicates otherwise. For example, "an element" may have the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes," and "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The example term "lower," can therefore, encompasses both an orientation of "lower" and "upper," depending on the orientation of the figure. Similarly, if the device in one of the figures is turned over, elements described as "below" or "beneath" other elements would then be oriented "above" the other elements. The example terms "below" or "beneath" can, therefore, encompass both an orientation of above and below.

"About" or "approximately" as used herein is inclusive of the stated value and values within an acceptable range of deviation from the stated value as determined by one of ordinary skill in the art, considering the measurement in question and the error associated with measurement of the stated quantity (e.g., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

Example embodiments are described herein with reference to cross section illustrations that are schematic illustrations of some embodiments. As such, variations from the shapes of the illustrations as a result, for example, of manufacturing techniques and/or tolerances, are to be expected. Thus, embodiments described herein should not be construed as limited to the disclosed shapes of regions as illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present disclosure or claims.

Hereinafter, embodiments of the present disclosure will be described with reference to the attached drawings. FIG. 1 is a perspective view of a display device according to an embodiment, and FIG. 2 is a plan view showing an example of a display panel according to an embodiment.

In this specification, the "on", "over", "top", "upper side", or "upper surface" refers to an upward direction with respect to a display panel 100, for example, a Z-axis direction, and the "beneath", "under", "bottom", "lower side", or "lower surface" refers to a downward direction with respect to the display panel 100, for example, a direction opposite to the Z-axis direction. Further, the "left", "right", "upper", and "lower" refer to directions when the display panel 100 is viewed from the plane. For example, the "left" refers to a direction opposite to the X-axis direction, the "right" refers to the X-axis direction, the "upper" refers to the Y-axis direction, and the "lower" refers to a direction opposite to the Y-axis direction.

A display device 10, which is a device for displaying a moving image or a still image, may be utilized as a display screen of various suitable products such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs). The display device 10 may be any one of an organic light emitting display device, a liquid crystal display device, a plasma display device, a field emission display device, an electrophoretic display device, an electrowetting display device, a quantum dot emission display device, and a micro LED display device. Hereinafter, the display device 10 will be described assuming that the display device 10 is an organic light emitting display device, but the present disclosure is not limited thereto.

Figure 2:
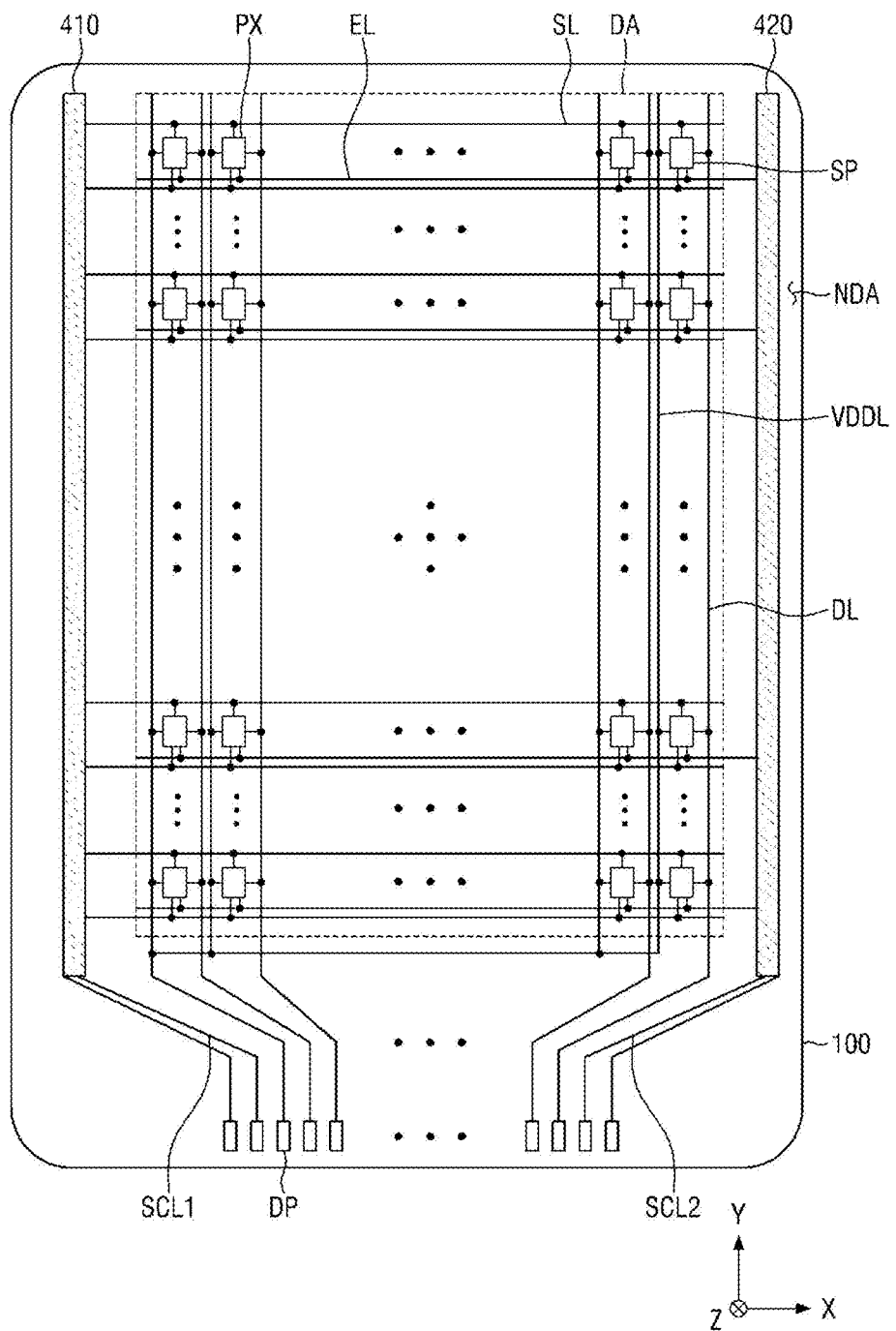
FIG. 2 is a plan view showing an example of a display panel according to an embodiment.

Referring to FIGS. 1 and 2, the display device 10 includes a display panel 100, a display driver 200, and a circuit board 300.

The display panel 100 may have a rectangular planar shape having short sides in a first direction (X-axis direction) and long sides in a second direction (Y-axis direction). The corner where the short side in the first direction (X-axis direction) meets the long side in the second direction (Y-axis direction) may be formed to have a round shape of a set or predetermined curvature or have a right angle (e.g., an angle equal to, or substantially equal to, 90°) shape. The planar shape of the display panel 100 is not limited to a rectangular shape, and may be formed in another polygonal shape, circular shape, or elliptical shape. The display panel 100 may be formed to be flat, but the present disclosure is not limited thereto. For example, the display panel 100 may include a curved portion formed at the left and right ends thereof and having a constant curvature or a variable curvature. In addition, the display panel 100 may be flexible to be bent, warped, folded, and/or rolled.

The display panel 100 may include a display area DA in which sub-pixels SP are formed to display an image, and a non-display area NDA, which is a peripheral area of the display area DA. When the display panel 100 includes a curved portion (e.g., a curved portion at the left and right ends of the display panel 100), the display area DA may be disposed on the curved portion. In this case, an image of the display panel 100 may also be seen on the curved portion.

The display area DA may be provided with scan lines SL, light emitting lines EL, data lines DL, and first driving voltage lines VDDL, which are connected to the sub-pixels SP, in addition to the sub-pixels SP. The scan lines SL and the light emitting lines EL may be arranged in parallel (e.g., substantially parallel) in the first direction (X-axis direction), and the data lines DL may be arranged in parallel (e.g., substantially parallel) in the second direction (Y-axis Direction) crossing the first direction (X-axis direction). The first driving voltage lines VDDL may be arranged in parallel (e.g., substantially parallel) in the second direction (Y-axis direction) in the display area DA. The first driving voltage lines VDDL arranged in parallel (e.g., substantially parallel) in the second direction (Y-axis direction) in the display area DA may be connected to each other in the non-display area NDA.

Each of the sub-pixels SP may be connected to at least one of the scan lines SL, at least one of the data lines DL, at least one of the light emitting lines EL, and at least one of the first driving voltage lines VDDL. Although it is shown in FIG. 2 that each of the sub-pixels SP is connected to two scan lines SL, one data line DL, one light emitting line EL, and the first driving voltage line VDDL, the present disclosure is not limited thereto, and, for example, each of the sub-pixels SP may be connected to three scan lines SL instead of two scan lines SL.

Each of the sub-pixels SP may include a driving transistor, at least one switching transistor, a light emitting element, and a capacitor. The driving transistor may supply a driving current to the light emitting element in accordance with a data voltage applied to the gate electrode of the driving transistor, thereby causing the light emitting element to emit light. The driving transistor and the at least one switching transistor may be thin film transistors. The light emitting element may emit light in accordance with the driving current of the driving transistor. The light emitting element may be an organic light emitting diode including a first electrode, an organic light emitting layer, and a second electrode. The capacitor may serve to keep the data voltage applied to the gate electrode of the driving transistor constant.

The non-display area NDA may be defined as an area from the outside of the display area DA to the edge of the display panel 100. For example, the non-display area NDA may partially or entirely surround the display area DA. The non-display area NDA may be provided with (e.g., include) a scan driver 410 for applying scan signals to the scan lines SL and pads DP connected to the data lines DL. In some embodiments, the non-display area NDA may be provided with (e.g., include) a light emission control driver 420 for applying light emission control signals to the light emitting lines EL. Because the circuit board 300 is attached onto the pads DP, the pads DP may be disposed at one side edge of the display panel 100, for example, the lower side edge (e.g., the lower edge) of the display panel 100.

The scan driver 410 may be connected to the display driver 200 through a plurality of first scan control lines SCL1. The scan driver 410 may receive a scan control signal from the pads DP through the plurality of first scan control lines SCL1. The scan driver 410 may generate scan signals according to the scan control signal, and may sequentially output the scan signals to the scan lines SL. Sub-pixels PX to which data voltages are to be supplied are selected by the scan signals of the scan driver 410, and data voltages are supplied to the selected sub-pixels PX.

A light emission control driver 420 may be connected to a display driving circuit through a plurality of second scan control lines SCL2. The light emission control driver 420 may receive a light emission control signal from the pads DP through the plurality of second scan control signals SCL2. The light emission control driver 420 may generate light emission control signals according to the light emission control signal received from the pads DP, and may sequentially output the light emission control signals to the light emitting lines EL.

Although it is illustrated in FIG. 2 that the scan driver 410 is disposed outside one side (e.g., the left side) of the display area DA and the light emission control driver 420 is disposed outside the other side (e.g., the right side) of the display area DA, the present disclosure is not limited thereto. Both the scan driver 410 and the light emission control driver 420 may be disposed outside one side of the display area DA, or may be disposed outside both sides (e.g., both the left side and the right side) of the display area DA.

The display driver 200 receives digital video data and timing signals from the outside. The display driver 200 converts the digital video data into analog positive/negative data voltages and supplies them to the data lines DL. The display driver 200 generates and supplies a scan control signal for controlling the operation timing of the scan driver 410 through the first scan control lines SCL1. The display driver 200 generates and supplies a light emission control signal for controlling the operation timing of the light emission control driver 420 through the second scan control lines SCL2. The display driver 200 may supply a first driving voltage to the first driving voltage line VDDL.

The display driver 200 may be formed as an integrated circuit (IC) and attached onto the circuit board 300 by a chip on film (COF) method. In some embodiments, the display driver 200 may be attached or directly attached onto the display panel 100 by a chip on glass (COG) method, a chip on plastic (COP) method, or an ultrasonic bonding method.

The circuit board 300 may be attached onto the pads DP utilizing an anisotropic conductive film. Thus, lead lines of the circuit board 300 may be electrically connected to the pads DP. The circuit board 300 may be a flexible film such as a flexible printed circuit board, a printed circuit board, or a chip on film.

Figure 3:
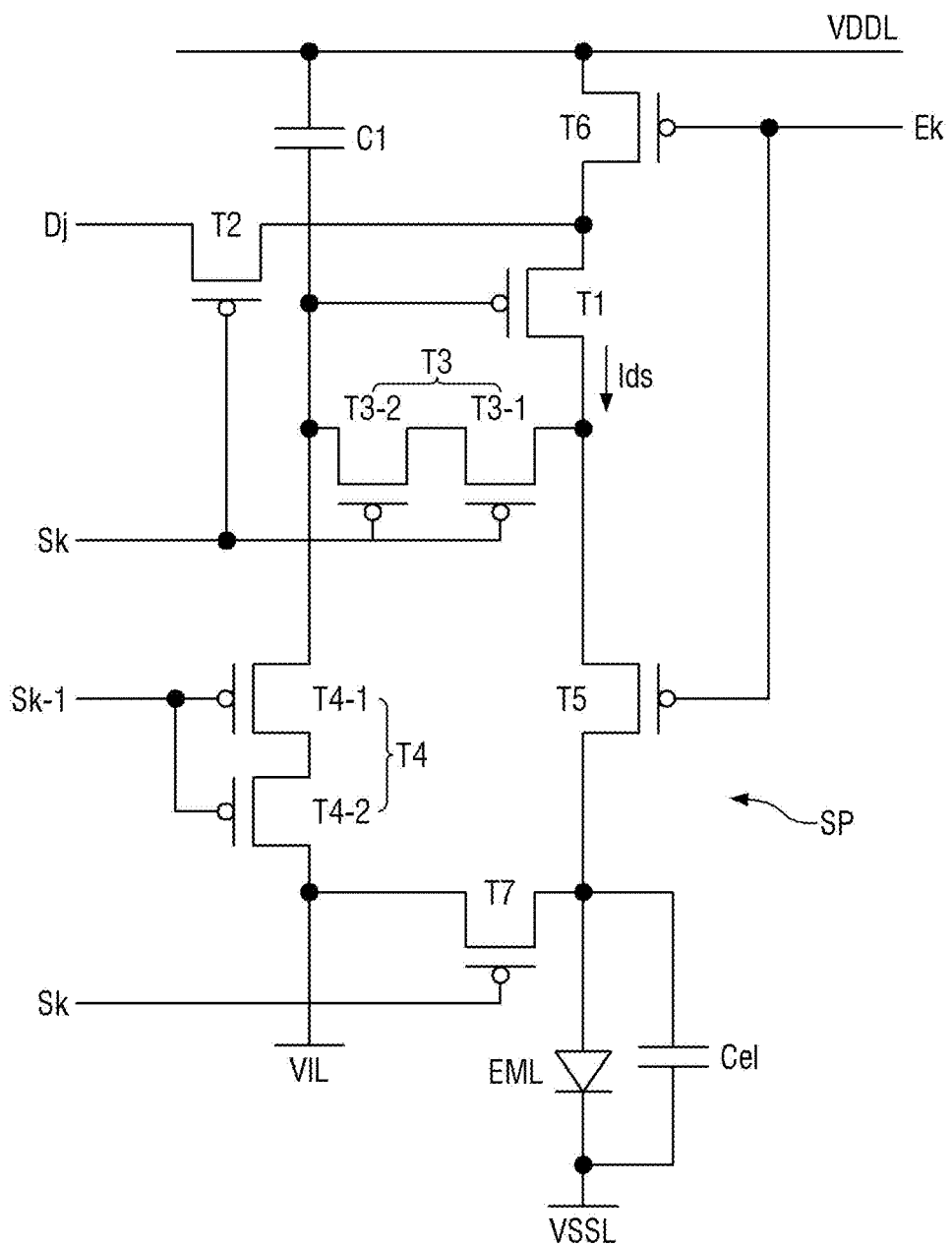
FIG. 3 is a circuit diagram illustrating an example of the sub-pixel of FIG. 2.

FIG. 3 is a circuit diagram illustrating an example of the sub-pixel of FIG. 2.

FIG. 3 illustrates a sub-pixel PX connected to a k−1$_{th}$ scan line Sk−1, a k$_{th}$ scan line Sk, and a j$_{th}$ data line Dj.

Referring to FIG. 3, the sub-pixel PX may overlap (e.g., be connected to) the k−1$_{th}$ scan line Sk−1, the k$_{th}$ scan line Sk, and the j$_{th}$ data line Dj. Further, the sub-pixel PX may be connected to a first driving voltage line VDDL to which a first driving voltage is applied, an initialization voltage line VIL to which an initialization voltage is applied, and a second driving voltage line VSSL to which a second driving voltage is applied.

The sub-pixel PX includes a driving transistor, a light emitting element EML, switch elements, and a first capacitor C1. For example, the sub-pixel PX may include a first transistor T1 as the driving transistor, and may include second to seventh transistors T2, T3, T4, T5, T6, and T7 as the switch elements. However, the sub-pixel PX of the present specification is not limited to that shown in FIG. 3.

The first transistor T1 may include a first gate electrode, a first source electrode, and a first drain electrode. The first transistor T1 controls a drain-source current Ids (hereinafter referred to as "driving current") according to the data voltage applied to the first gate electrode of the first transistor T1. The driving current Ids flowing through the channel of the first transistor T1 is proportional to a square of a difference between a gate-source voltage Vgs and a threshold voltage Vth of the first transistor T1 as shown in Equation 1 below.

$$Ids = k' \times (Vgs - Vth)^2 \quad \quad \text{[Equation 1]}$$

In Equation 1, k' is a proportional coefficient determined by the structure and physical characteristics of the first transistor T1, Vgs is a voltage between the first gate electrode and first source electrode of the first transistor T1, and Vth is a threshold voltage of the first transistor T1.

The light emitting element EML emits light in accordance with the driving current Ids. The light emission amount of the light emitting element EML may be proportional to the driving current Ids.

The light emitting element EML may be an organic light emitting diode including a first electrode (e.g., anode electrode), a second electrode (e.g., cathode electrode), and an organic light emitting layer disposed between the first electrode and the second electrode. In some embodiments, the light emitting element EML may be an inorganic light emitting element including a first electrode, a second electrode, and an inorganic semiconductor disposed between the first electrode and the second electrode. In some embodiments, the light emitting element EML may be a quantum dot light emitting element including a first electrode, a second electrode, and a quantum dot light emitting layer disposed between the first electrode and the second electrode. In some embodiments, the light emitting element EML may be a micro light emitting diode.

The first electrode of the light emitting element EML may be connected to a fifth drain electrode of the fifth transistor T5, and the second electrode of the light emitting element EML may be connected to the second driving voltage line VSSL. A parasitic capacitance Cel may be formed between the anode electrode and cathode electrode of the light emitting element EML.

The second transistor T2 is turned on by the scan signal of the $k_{th}$ scan line Sk to connect the first source electrode of the first transistor T1 to the $j_{th}$ data line DLj. The second transistor T2 may include a second gate electrode, a second source electrode, and a second drain electrode. The second gate electrode of the second transistor T2 may be connected to the $k_{th}$ scan line Sk, the second source electrode of the second transistor T2 may be connected to the first source electrode of the first transistor T1, and the second drain electrode of the second transistor T2 may be connected to the $j_{th}$ data line Dj.

The third transistor T3 may be formed as a dual transistor including a third-first transistor T3-1 and a third-second transistor T3-2. The third-first transistor T3-1 and the third-second transistor T3-2 are turned on by the scan signal of the $k_{th}$ scan line Sk to connect the first gate electrode of the first transistor T1 to the first drain electrode of the first transistor T1. For example, when the third-first transistor T3-1 and the third-second transistor T3-2 are turned on, the first gate electrode of the first transistor T1 is connected to the first drain electrode of the first transistor T1, and thus the first transistor T1 is driven as a diode (e.g., the first transistor T1 is diode-connected). The third-first transistor T3-1 may include a third-first gate electrode, a third-first source electrode, and a third-first drain electrode. The third-first gate electrode of the third-first transistor T3-1 may be connected to the $k_{th}$ scan line Sk, the third-first source electrode of the third-first transistor T3-1 may be connected to the first drain electrode of the first transistor T1, and the third-first drain electrode of the third-first transistor T3-1 may be connected to a third-second source electrode of the third-second transistor T3-2. The third-second transistor T3-2 may include a third-second gate electrode, a third-second source electrode, and a third-second drain electrode. The third-second gate electrode of the third-second transistor T3-2 may be connected to the $k_{th}$ scan line Sk, the third-second source electrode of the third-second transistor T3-2 may be connected to the third-first drain electrode of the third-first transistor T3-1, and the third-second drain electrode of the third-second transistor T3-2 may be connected to the first gate electrode of the first transistor T1.

The fourth transistor T4 may be formed as a dual transistor including a fourth-first transistor T4-1 and a fourth-second transistor T4-2. The fourth-first transistor T4-1 and the fourth-second transistor T4-2 are turned on by the scan signal of the $k-1_{th}$ scan line Sk-1 to connect the first gate electrode of the first transistor T1 to the initialization voltage line VIL. Therefore, the first gate electrode of the first transistor T1 may be discharged to the initialization voltage of the initialization voltage line VIL. The fourth-first transistor T4-1 may include a fourth-first gate electrode, a fourth-first source electrode, and a fourth-first drain electrode. The fourth-first gate electrode of the fourth-first transistor T4-1 may be connected to the $k-1_{th}$ scan line Sk-1, the fourth-first source electrode of the fourth-first transistor T4-1 may be connected to the first drain electrode of the first transistor T1, and the fourth-first drain electrode of the fourth-first transistor T4-1 may be connected to a fourth-second source electrode of the fourth-second transistor T4-2. The fourth-second transistor T4-2 may include a fourth-second gate electrode, a fourth-second source electrode, and a fourth-second drain electrode. The fourth-second gate electrode of the fourth-second transistor T4-2 may be connected to the $k-1_{th}$ scan line Sk-1, the fourth-second source electrode of the fourth-second transistor T4-2 may be connected to the fourth-first drain electrode of the fourth-first transistor T4-1, and the fourth-second drain electrode of the fourth-second transistor T4-2 may be connected to the initialization voltage line VIL.

The fifth transistor T5 is connected between the first drain electrode of the first transistor T1 and the anode electrode of the light emitting element EML. The fifth transistor T5 is turned on by the light emission control signal of the $k_{th}$ light emitting line Ek to connect the first drain electrode of the first transistor T1 to the anode electrode of the light emitting element EML. The fifth transistor T5 may include a fifth gate electrode, a fifth source electrode, and a fifth drain electrode. The fifth gate electrode of the fifth transistor T5 is connected to the $k_{th}$ light emitting line Ek, the fifth source electrode of the fifth transistor T5 is connected to the first drain electrode of the first transistor T1, and the fifth drain electrode of the fifth transistor T5 is connected to the anode electrode of the light emitting element EML.

The sixth transistor T6 is turned on by the light emission control signal of the $k_{th}$ light emitting line Ek to connect the first source electrode of the first transistor T1 to the first driving voltage line VDDL. The sixth transistor T6 may include a sixth gate electrode, a sixth source electrode, and a sixth drain electrode. The sixth gate electrode of the sixth transistor T6 is connected to the $k_{th}$ light emitting line Ek, the sixth source electrode of the sixth transistor T6 is connected to the first driving voltage line VDDL, and the sixth drain electrode of the sixth transistor T6 is connected to the first source electrode of the first transistor T1. When both the fifth transistor T5 and the sixth transistor T6 are turned on, the driving current Ids may be supplied to the light emitting element EML.

The seventh transistor T7 is turned on by the scan signal of the $k_{th}$ scan line Sk to connect the anode electrode of the light emitting element EML to the initialization voltage line VIL. The anode of the light emitting device EML may be discharged to the initialization voltage. The seventh transistor T7 may include a seventh gate electrode, a seventh source electrode, and a seventh drain electrode. The seventh gate electrode of the seventh transistor T7 is connected to the $k_{th}$ scan line Sk, the seventh source electrode of the seventh transistor T7 is connected to the anode electrode of the light emitting element EML, and the seventh drain electrode of the seventh transistor T7 is connected to the initialization voltage line VIL.

The first capacitor C1 is formed between the first drain electrode of the first transistor T1 and the first driving voltage line VDDL. One electrode of the first capacitor C1 may be connected to the first drain electrode of the first transistor T1, and the other electrode of the first capacitor C1 may be connected to the first driving voltage line VDDL.

Each of the first to seventh transistors T1, T2, T3, T4, T5, T6, and T7 may include a semiconductor layer. Some of the first to seventh transistors T1, T2, T3, T4, T5, T6, and T7 may include semiconductor layers including (e.g., being) polycrystalline silicon, and other some of the first to seventh transistors T1, T2, T3, T4, T5, T6, and T7 may include semiconductor layers including (e.g., being) oxide. For example, the semiconductor layers of the first to seventh transistors T1, T2, T3, T4, T5, T6, and T7 may include (e.g., be made of) polycrystalline silicon. In some embodiments, the semiconductor layers of the first transistor T1 and the fifth to seventh transistors T5 to T7 from among the first to seventh transistors T1, T2, T3, T4, T5, T6, and T7 may include (e.g., be made of) polycrystalline silicon and the semiconductor layers of the third transistor T3 and the fourth transistor T4 from among the first to seventh transistors T1, T2, T3, T4, T5, T6, and T7 may include (e.g., be made of) oxide.

Figure 4:
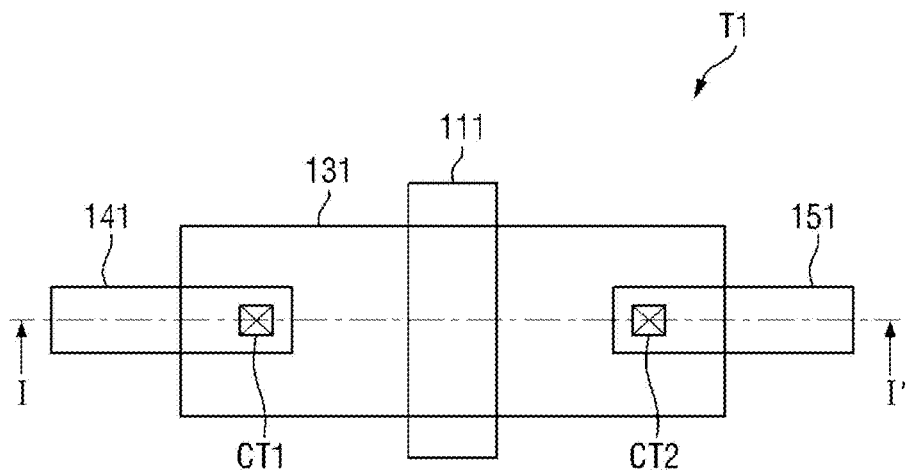
FIG. 4 is a plan view illustrating an example of the first transistor of FIG. 3.
Figure 5:
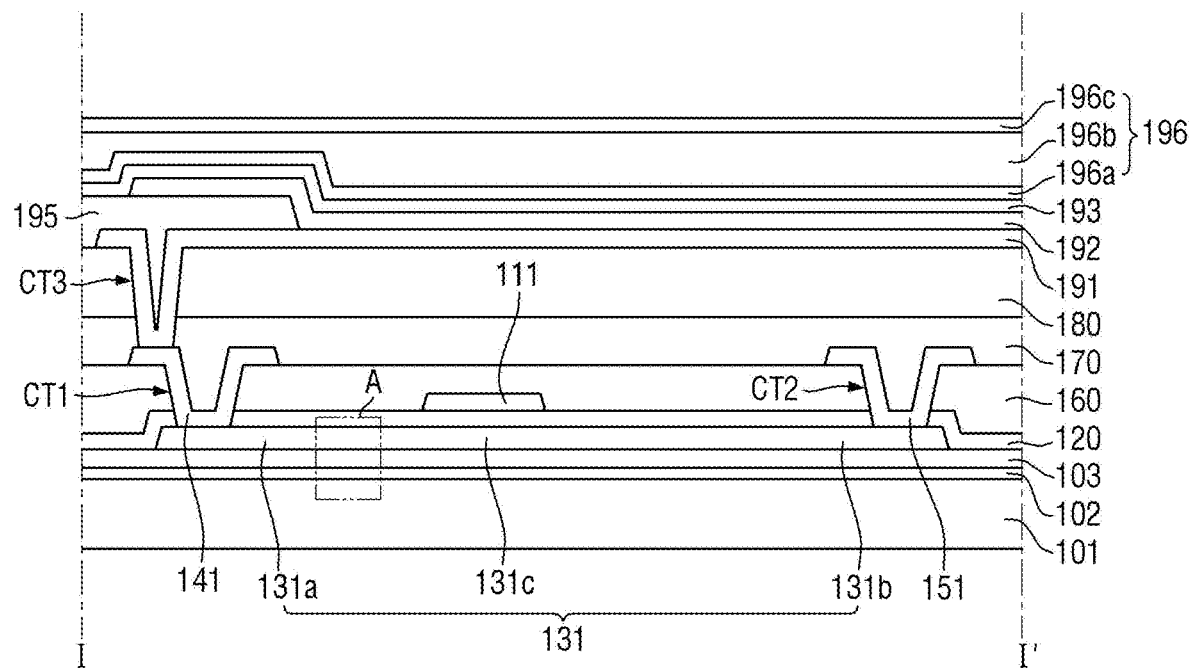
FIG. 5 is a cross-sectional view taken along the line I-I' of FIG. 4.
Figure 6:
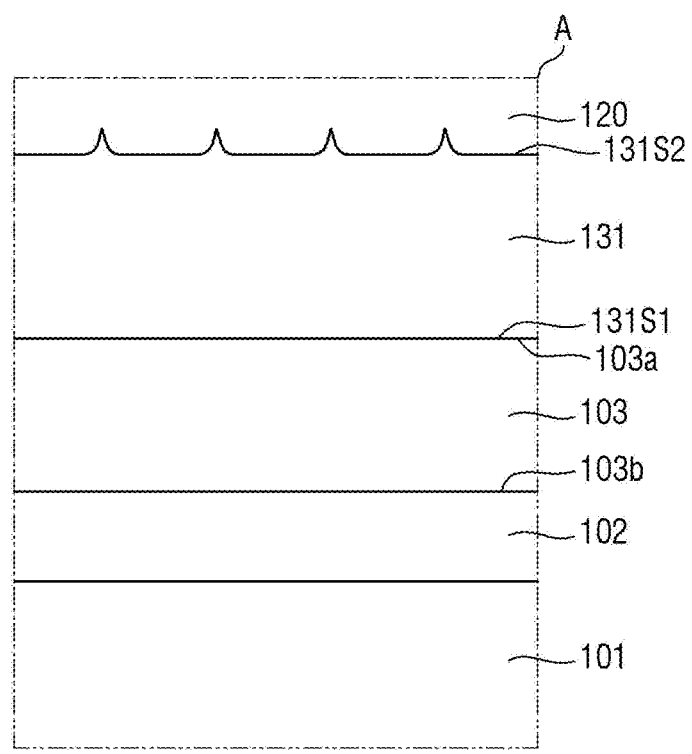
FIG. 6 is an enlarged view of the area A of FIG. 5.

FIG. 4 is a plan view illustrating an example of the first transistor of FIG. 3, FIG. 5 is a cross-sectional view taken along the line I-I' of FIG. 4, and FIG. 6 is an enlarged view of the area A of FIG. 5.

Referring to FIGS. 4 to 6, the first transistor T1 may include a gate electrode 111, a semiconductor layer, a drain electrode 141, and a source electrode 151. The semiconductor layer of the first transistor T1 may include (e.g., be made of) polycrystalline silicon. Hereinafter, the semiconductor layer of the first transistor T1 will be referred to as a polycrystalline silicon film 131.

Although FIGS. 4 to 6 illustrate only the first transistor T1, the description of the first transistor T1 in FIGS. 4 to 6 may be applied to a transistor including a semiconductor layer including (e.g., made of) polycrystalline silicon as it is within the scope of the technical idea.

Referring to FIG. 4, the gate electrode 111 may be disposed on the polycrystalline silicon film 131. The gate electrode 111 may be disposed at the center or center portion of the polycrystalline silicon film 131 to overlap the polycrystalline silicon film 131.

The drain electrode 141 may be disposed at the left side of the center portion of the polycrystalline silicon film 131 to overlap the polycrystalline silicon film 131. The drain electrode 141 may be electrically connected to the polycrystalline silicon film 131 through a first contact hole CT1.

The source electrode 151 may be disposed at the right side of the center portion of the polycrystalline silicon film 131 to overlap the polycrystalline silicon film 131. The source electrode 151 may be electrically connected to the polycrystalline silicon film 131 through a second contact hole CT2. The center portion of the polycrystalline silicon film 131, overlapping the gate electrode 111, may be defined as a channel region; the region of the polycrystalline silicon film 131, overlapping the drain electrode 141, may be defined as a drain region; and the region of the polycrystalline silicon film 131, overlapping the source electrode 151, may be defined as a source region. For example, the polycrystalline silicon film 131 may include the channel region at the center portion thereof, the drain region at the left side thereof, and the source region at the right side thereof.

Referring to FIG. 5, a substrate 101 may be a rigid substrate or a flexible substrate capable of bending, folding, rolling, and/or the like. The substrate 101 may include (e.g., be made of) an insulating material such as glass, quartz, and/or polymer resin.

A buffer film may be formed on the substrate 101. The buffer film according to an embodiment may be a laminated film of a plurality of films. For example, the buffer film may include a first buffer film 102 formed on the substrate 101 and a second buffer film 103 formed on the first buffer film 102.

The first buffer film 102 may be formed on the substrate 101 to protect transistors and a light emitting layer 192 from moisture and/or impurities (e.g., F, C—H) penetrating through the substrate 101.

The first buffer film 102 may be formed of at least one inorganic film selected from among a silicon oxide film, a silicon nitride film, a silicon oxynitride film, a titanium oxide film, and an aluminum oxide film. For example, the first buffer film 102 may include (e.g., be) a silicon nitride film. In some cases, the first buffer film 102 may serve to prevent or block heat from being discharged during the manufacture of the polycrystalline silicon film 131. In some embodiments, the first buffer film 102 may serve to provide a large amount of hydrogen ions during the manufacture of the polycrystalline silicon film 131 and/or after the manufacture of the polycrystalline silicon film 131. The large amount of hydrogen ions provided during the manufacture of the polycrystalline silicon film 131 and/or after the manufacture of the polycrystalline silicon film 131 may serve to recover (e.g., heal, repair, or alleviate) the internal defects of an amorphous silicon film during the manufacture of the polycrystalline silicon film 131 or to recover the internal defects of the polycrystalline silicon film 131 after the manufacture of the polycrystalline silicon film 131.

Similarly to the first buffer film 102, the second buffer film 103 on the first buffer film 102 may serve to protect the transistors and the light emitting layer 192 from moisture and/or impurities (e.g., F, C—H) penetrating through the substrate 101.

The thickness of the second buffer film 103 may be greater than that of the first buffer film 102. For example, the thickness of the second buffer film 103 may be about 10 times or more than the thickness of the first buffer film 102, but is not limited thereto.

The second buffer film 103 may include (e.g., be formed of) at least one inorganic film selected from among a silicon oxide film, a silicon nitride film, a silicon oxynitride film, a titanium oxide film, and an aluminum oxide film. For example, the second buffer film 103 may include (e.g., be) a silicon oxide film.

The second buffer film 103 may serve to prevent or block heat from being discharged during the manufacture of the polycrystalline silicon film 131. Similarly to the first buffer film 102, the second buffer film 103 may serve to provide a large amount of hydrogen ions during the manufacture of the polycrystalline silicon film 131 and/or after the manufacture of the polycrystalline silicon film 131. The large amount of hydrogen ions provided during the manufacture of the polycrystalline silicon film 131 and/or after the manufacture of the polycrystalline silicon film 131 may serve to recover the internal defects of an amorphous silicon film during the manufacture of the polycrystalline silicon film 131 or to recover the internal defects of the polycrystalline silicon film 131 after the manufacture of the polycrystalline silicon film 131. However, in an example embodiment in which the first buffer film 102 includes (e.g., is) a silicon nitride film and the second buffer film 103 includes (e.g., is) a silicon oxide film, the concentration of hydrogen ions in the second buffer film 103 may be remarkably higher than the concentration of hydrogen ions in the first buffer film 102. Thus, the source of the large amount of hydrogen ions provided during the manufacture of the polycrystalline silicon film 131 and/or after the manufacture of the polycrystalline silicon film 131 may be substantially the second buffer film 103.

The polycrystalline silicon film 131 of the first transistor T1 may be disposed on the second buffer film 103. As described above, the polycrystalline silicon film 131 may be divided into a drain region 131a, a source region 131b, and a channel region 131c.

A gate insulating film 120 may be disposed on the polycrystalline silicon film 131. The gate insulating film 120 may include (e.g., be) an inorganic material. For example, the gate insulating film 120 may be formed of at least one inorganic film selected from among a silicon oxide film, a silicon nitride film, a silicon oxynitride film, a titanium oxide film, and an aluminum oxide film. Although it is illustrated in FIG. 5 that the gate insulating film 120 is disposed over the entire surface of the polycrystalline silicon film 131 to cover the polycrystalline silicon film 131, the present disclosure is not limited thereto. The gate insulating film 120 may be disposed only in an area where the polycrystalline silicon film 131 overlaps a gate electrode 111 to be described later.

The gate electrode 111 of the first transistor T1 may be disposed on the channel region 131c of the polycrystalline silicon film 131. The gate electrode 111 of the first transistor T1 may be formed of a single layer or multiple layers including (e.g., being) any one of molybdenum (Mo), aluminum (Al), chromium (Cr), gold (Au), titanium (Ti), nickel (Ni), neodymium (Nd), copper (Cu), and/or an alloy thereof.

A first insulating film 160 may be disposed on the gate electrode 111 of the first transistor T1. The first insulating film 160 may include (e.g., be) an organic insulating material and/or an inorganic insulating material.

A drain electrode 141 and a source electrode 151 may be disposed on the first insulating film 160. The drain electrode 141 may be electrically connected to the drain region 131a of the polycrystalline silicon film 131 through a first contact hole CT1, and the source electrode 151 may be electrically connected to the source region 131b of the polycrystalline silicon film 131 through a second contact hole CT2. The drain electrode 141 and the source electrode 151 may be formed of a single layer or multiple layers including (e.g., being) any one of molybdenum (Mo), aluminum (Al), chromium (Cr), gold (Au), titanium (Ti), nickel (Ni), neodymium (Nd), copper (Cu), and/or an alloy thereof.

A second insulating film 170 may be disposed on the source electrode 151 and the drain electrode 141. The second insulating film 170 may include (e.g., be) an organic insulating material and/or an inorganic insulating material. The second insulating film 170 may be a protective film to protect the source electrode 151 and the drain electrode 141.

Although it is illustrated in FIG. 5 that the first transistor T1 is formed by a top gate method, the present disclosure is not limited thereto. For example, the first transistor T1 may be formed by a bottom gate method in which the gate electrode 111 is located under the polycrystalline silicon film 131 or a double gate method in which the gate electrode 111 is located over and under the polycrystalline silicon film 131.

A third insulating film 180 may be disposed on the second insulating film 170. The third insulating film 180 may include (e.g., be) an organic insulating material and/or an inorganic insulating material. The third insulating film 180 may be a planarization film. The third insulating film 180 may be formed of an organic film including (e.g., being) an acrylic resin, an epoxy resin, a phenolic resin, a polyamide resin, and/or a polyimide resin.

A first electrode 191 of a light emitting element EML and a pixel defining film 195 may be disposed on the third insulating film 180. The first electrode 191 may be a pixel electrode. The first electrode 191 may be electrically connected to the drain electrode 141 through a third contact hole CT3. In the top emission structure in which light is emitted toward the second electrode 193 based on (e.g., from) a light emitting layer 192, the first electrode 191 may be formed of a metal material having high reflectance. For example, the first electrode 191 may be formed of a laminated structure (Ti/Al/Ti) of aluminum and titanium, a laminated structure (ITO/Al/ITO) of aluminum and ITO, an APC alloy, or a laminated structure (ITO/APC/ITO) of an APC alloy and ITO. The APC alloy is an alloy of silver (Ag), palladium (Pd), and copper (Cu). In some embodiments, the first electrode 191 may be formed of a single layer of molybdenum (Mo), titanium (Ti), copper (Cu), and/or aluminum (Al).

The pixel defining film 195 may be formed on the third insulating film 180 to divide the first electrode 191 in order to define the light emitting area of each of the sub-pixels PX. For example, in some embodiments, the pixel defining film 195 may separate first electrodes 191 of the plurality of sub-pixels PX. For this purpose, the pixel defining film 195 may be formed to cover the edge of the first electrode 191. The light emitting area of each of the sub-pixels PX is an area in which the first electrode 191, the organic light emitting layer 192, and the second electrode 193 are sequentially laminated, and holes from the first electrode 191 and electrons from the second electrode 193 are combined with each other in the organic light emitting layer 192 to emit light. The pixel defining film 195 may be formed as an organic film including (e.g., being) an acrylic resin, an epoxy resin, a phenolic resin, a polyamide resin, and/or a polyimide resin. In some embodiments, the pixel defining film 195 may include (e.g., be) an inorganic material.

The light emitting layer 192 is formed on the first electrode 191 and the pixel defining film 195. The light emitting layer 192 includes (e.g., is) an organic material to emit light of a set or predetermined color. For example, the light emitting layer 192 may include a hole transporting layer, an organic material layer, and an electron transporting layer.

The second electrode 193 is formed on the light emitting layer 192. The second electrode 193 may be formed to cover the light emitting layer 192. The second electrode 193 may be a common layer commonly formed in the sub-pixels PX.

In the top emission structure, the second electrode 193 may include (e.g., be formed of) a transparent conductive material such as ITO and/or IZO, which may transmit light, or may include (e.g., be formed of) a semi-transmissive conductive material.

An encapsulation film 196 may be formed on the second electrode 193. The encapsulation film 196 may include at least one inorganic film to prevent or block oxygen and/or moisture from penetrating into the light emitting layer 192. Further, the encapsulation film 196 may include at least one organic film to protect the light emitting layer 192 from foreign matter such as dust. For example, the encapsulation film 196 may include a first inorganic encapsulation film 196a on the second electrode 193, an organic encapsulation film 196b on the first inorganic encapsulation film 196a, and a second inorganic encapsulation film 196c on the organic encapsulation film 196b.

In some embodiments, an encapsulation substrate, instead of the encapsulation film 196, is disposed on the second electrode 193. A space between the second electrode 193 and the encapsulation substrate may be empty in a vacuum state or may be provided therein with a filling film. The filling film may be an epoxy filling film or a silicone filling film.

Referring to FIG. 6, the polycrystalline silicon film 131 may be directly disposed on the second buffer film 103. The second buffer film 103 includes one surface 103a (e.g., an upper surface) contacting the polycrystalline silicon film 131 and the other surface 103b (e.g., a lower surface) opposite to the one surface 103a. The polycrystalline silicon film 131 may include one surface 131S1 (e.g., a lower surface) contacting the one surface 103a of the second buffer film 103, and another surface 131S2 (e.g., an upper surface) opposite to the one surface 131S1.

As described above, the polycrystalline silicon film 131 may include the drain region 131a, the source region 131b, and the channel region 131c of the first transistor T1 to function as a current path. Because current is inversely proportional to resistance, the low internal resistance in the polycrystalline silicon film 131 is preferable (e.g., useful) for functioning as the current path of the polycrystalline silicon film 131. When the function of the polycrystalline silicon film 131 as the current path is deteriorated, device characteristics of a transistor to be described later may be deteriorated. The deterioration in device characteristics of a transistor may cause the deterioration in mobility of a transistor and may cause the occurrence of hysteresis of a transistor.

The internal resistance of the polycrystalline silicon film 131 may be related to the kind of main crystals, the size of crystals, and the presence of a healing medium for alleviating defects in the polycrystalline silicon film 131.

First, when the main crystals of the polycrystalline silicon film 131 are first crystals having a {100} plane direction ([001] crystal direction), the amount of defects in the polycrystalline silicon film 131 is reduced to lower internal resistance, and thus device characteristics of the first transistor T1 may be improved.

For example, the main crystals of the polycrystalline silicon film 131 according to an embodiment are first crystals having a {100} plane direction ([001] crystal direction), and the number of first crystals may be about 20% or more of the total number of crystals. Moreover, the number of first crystals may be about 70% or more of the sum of the number of first crystals, the number of second crystals having a {101} plane direction, and the number of third crystals having a {111} plane direction.

Moreover, the average size of crystals of the polycrystalline silicon film 131 according to an embodiment may be 350 nm or more. For example, the average size of crystals of the polycrystalline silicon film 131 may be 396 nm or more. As used herein, the term nm may refer to a distance equal to $10^{-9}$ meters.

In the polycrystalline silicon film 131 according to an embodiment, the kind of main crystals and the average size of crystals are related to the roughness of the one surface 103a of the second buffer film 103. For example, as the roughness of the one surface 103a of the second buffer film 103 is small, the number of first crystals having a {100} plane direction as main crystals may increase, and the overall size of the crystals may increase.

As the healing medium for alleviating internal defects, hydrogen ions provided from the lower buffer films 102 and 103 may be utilized. The polycrystalline silicon film 131 includes a large number of defects (bonds between silicon and silicon are broken) in an amorphous silicon state before heat treatment. When the defects in the amorphous silicon state is heat-treated, the defects remain without being healed even when amorphous silicon melts, and thus these defects act as defects of the polycrystalline silicon film 131.

When amorphous silicon is heat-treated, hydrogen ions provided from the lower buffer films 102 and 103 may be discharged from the lower buffer films 102 and 103 and then introduced into upper amorphous silicon to heal a large number of defects (connect the broken bonds between silicon and silicon). When the hydrogen ions are introduced into upper amorphous silicon and heal a plurality of defects during heat treatment, the overall size of crystals to be formed later increases, and as a result, a polycrystalline silicon film 131 having a low internal resistance may be formed.

In some cases, even when the hydrogen ions introduced into upper amorphous silicon do not heal a plurality of defects during heat treatment, the hydrogen ions may serve to heal the defects of the polycrystalline silicon film 131 formed after heat treatment.

For example, from the viewpoint of healing to alleviate the internal defects of amorphous silicon during heat treatment and/or the polycrystalline silicon film 131 after heat treatment, it is preferable (e.g., useful) that a large amount of hydrogen ions flow into amorphous silicon during heat treatment, but pinholes may be generated in amorphous silicon deposited on the second buffer film 103 when the roughness of the second buffer film 103 is large. The pinholes may completely penetrate the amorphous silicon from one surface of the amorphous silicon contacting the one surface 103a of the second buffer film 103 to the other surface of the amorphous silicon opposite to the one surface of the amorphous silicon. Thus, hydrogen ions that need to recombine broken silicon-silicon bonds, and which are introduced into amorphous silicon during the heat treatment of amorphous silicon, may be discharged to the outside through the pinholes.

For example, as the roughness of the second buffer film 103 decreases, the crystal size of the polycrystalline silicon film 131 increases, and simultaneously (e.g., also) the polycrystalline silicon film 131 may have first crystals having small internal defects in a crystal direction as main crystals. In addition, as the roughness of the second buffer film 103 decreases, the formation of pinholes in the deposited amorphous silicon is suppressed to form more dense amorphous silicon, so that the concentration of hydrogen ions, which is a healing medium, in amorphous silicon during heat treatment and/or amorphous silicon after heat treatment increases to reduce internal defects, thereby improving the device characteristics of the first transistor T1.

The one surface 103a of the second buffer film 103 may have a first roughness range, one surface 131S1 of the polycrystalline silicon film 131 may have a second roughness range, and the other surface 131S2 of the polycrystalline silicon film 131 may have a third roughness range. The polycrystalline silicon film 131 may be directly disposed on the second buffer film 103 and conformally reflect the roughness of the one surface 103a of the second buffer film 103. For example, the second roughness range of the one surface 131S1 of the polycrystalline silicon film 131 may be the same (e.g., substantially the same) as the first roughness range of the one surface 103a of the second buffer film 103.

The third roughness range of the other surface 131S2 of the polycrystalline silicon film 131 may be greater than the second roughness range of one surface 131S1 of the polycrystalline silicon film 131. As shown in FIG. 6, the other surface 131S2 of the polycrystalline silicon film 131 may include a plurality of convex portions that are raised upward. The plurality of convex portions of the other surface 131S2 of the polycrystalline silicon film 131 may be formed at the boundary of the crystals of the polycrystalline silicon film 131. The method for determining the first roughness range, the second roughness range, and the third roughness range will be described later.

Figure 7:
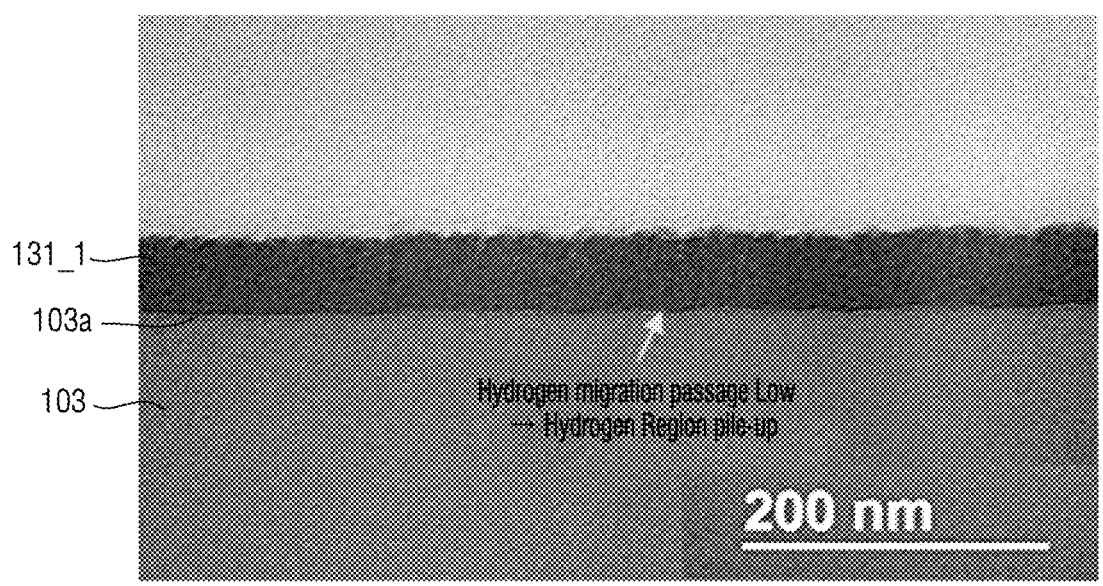
FIG. 7 is a photograph illustrating a second buffer film and an amorphous silicon film according to an embodiment.

FIG. 7 is a photograph illustrating a second buffer film and an amorphous silicon film according to an embodiment. FIG. 7 shows a cross section of the second buffer film 103 and the deposited amorphous silicon film 131_1 through a transmission electron microscope (TEM).

Referring to FIG. 7, the amorphous silicon film 131_1 may be conformally deposited on the one surface 103a of the second buffer film 103. After improving the roughness of the second buffer film 103, it may be ascertained that the amorphous silicon film 131_1 may be uniformly well deposited on the one surface 103a of the second buffer film 103. For example, the pinholes formed in the amorphous silicon film 131_1 may be greatly reduced by improving the roughness of the second buffer film 103.

Figure 8:
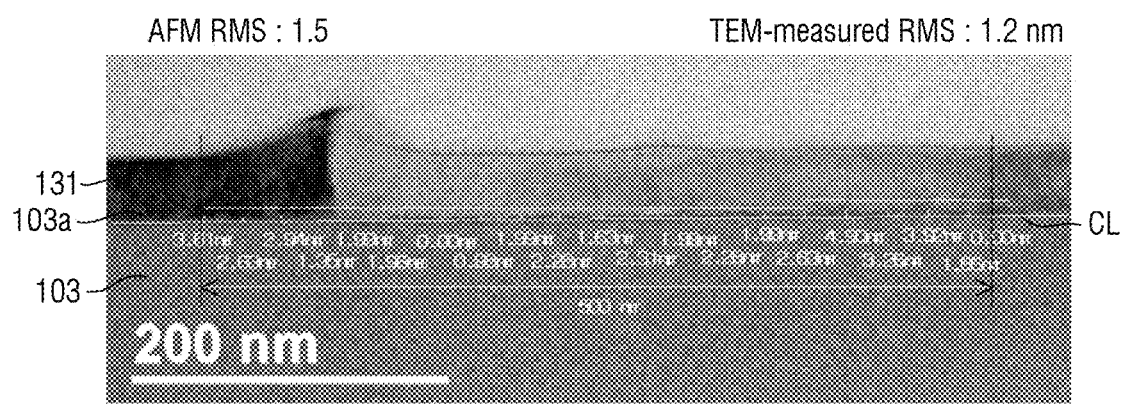
FIG. 8 is a photograph illustrating the measurement of first roughness of a second buffer film.

FIG. 8 is a photograph illustrating the measurement of first roughness of a second buffer film according to an embodiment. Although FIG. 8 illustrates (e.g., is for describing) only the method of determining the first roughness of the second buffer film 103, the method of determining the second roughness and third roughness of the polycrystalline silicon film 131 may be the same as the method of determining the first roughness of the second buffer film 103, and therefore, a redundant description thereof may not be repeated. In an embodiment, it is only illustrated only to measure the roughness through the TEM, it is possible to measure the roughness through the AFM method without being limited thereto.

Referring to FIG. 8, a reference line CL is applied horizontally in a region where the second buffer film 103 has a length of 500 nm (continuous section) through a transmission electron microscope (TEM) at an observation magnification of 30,000, and 20 points are measured at intervals of 25 nm. For example, each of the 20 points may be a measurement of the distance between the reference line CL and the one surface 103a of the second buffer film 103 at a corresponding one of the 20 intervals. The standard deviation RMS value of the measured values may be determined as (e.g., may provide a measure of) the first roughness of the one surface 103a of the second buffer film 103. As used herein, RMS may refer to the root mean square of a set of data.

In an embodiment, the first roughness range of the one surface 103a of the second buffer film 103, determined by horizontally applying the reference line CL and measuring 20 points at intervals of 25 nm, may be 1.5 nm or less.

The one surface 103a of the second buffer film 103 may have substantially the same roughness within the first roughness range over the entire region. In this specification, the meaning that one surface 103a of the second buffer film 103 may have substantially the same roughness should be understood as a concept that not only the one surface 103a of the second buffer film 103 has completely the same roughness within the first roughness range over the entire region but also that the one surface 103a of the second buffer film 103 has a deviation of about 10% or less over the entire region, which may be hard to discern visually.

As described above with reference to FIG. 6, the second roughness range of the one surface 131S1 of the polycrystalline silicon film 131 is the same as the first roughness range, and thus the second roughness range may be 1.5 nm or less.

The one surface 131S1 of the polycrystalline silicon film 131 may have substantially the same roughness within the second roughness range over the entire region.

The third roughness range of the other surface 131S2 of the polycrystalline silicon film 131 may be greater than the second roughness range. Therefore, the third roughness range of the other surface 131S2 of the polycrystalline silicon film 131 may be more than 1.5 nm, for example, 10 nm or more.

The other surface 131S2 of the polycrystalline silicon film 131 may have substantially the same roughness within the third roughness range over the entire region.

Figure 9:
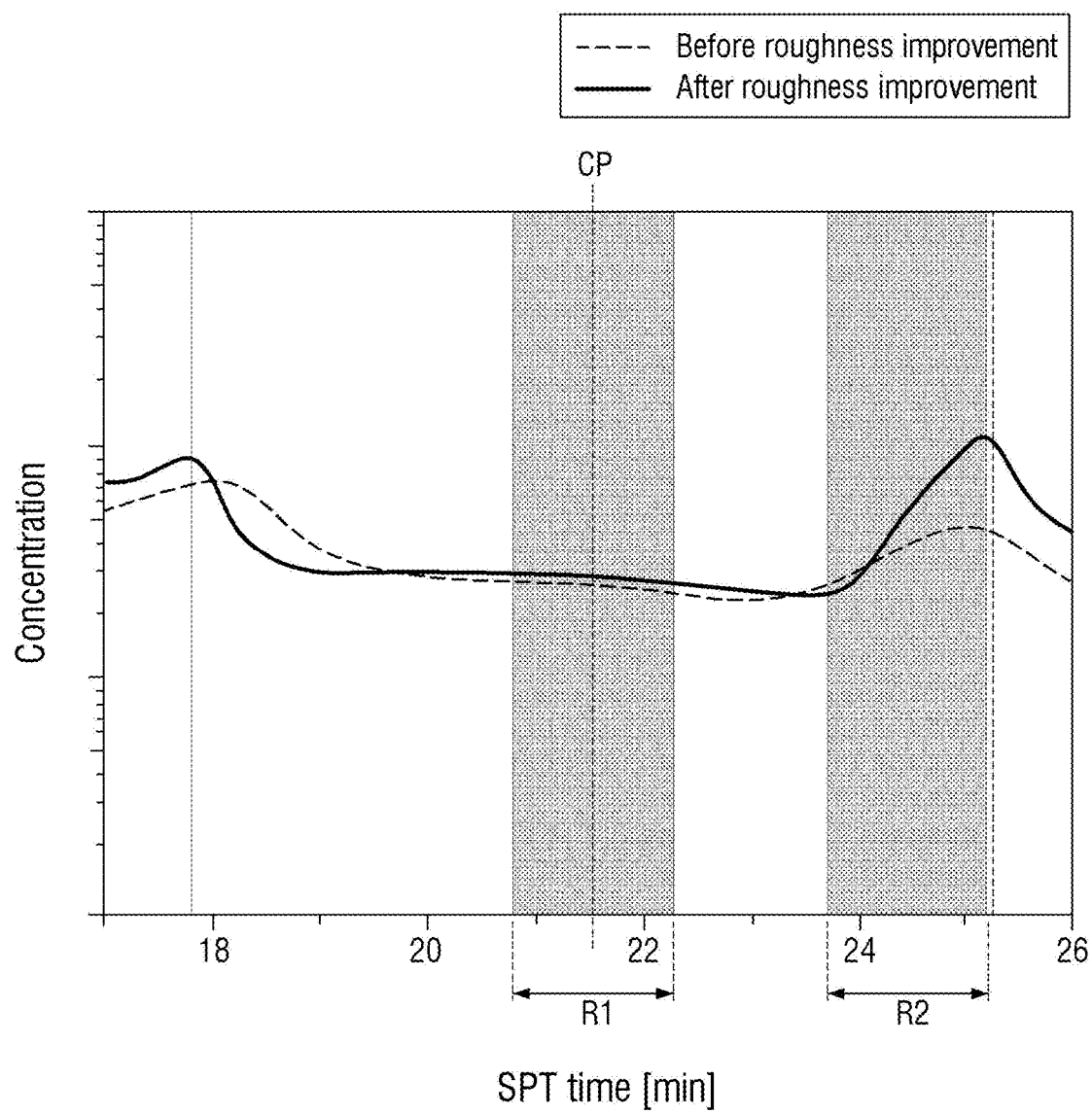
FIGS. 9 to 11 are graphs illustrating the concentration distribution of hydrogen ions in the polycrystalline silicon film.
Figure 10:
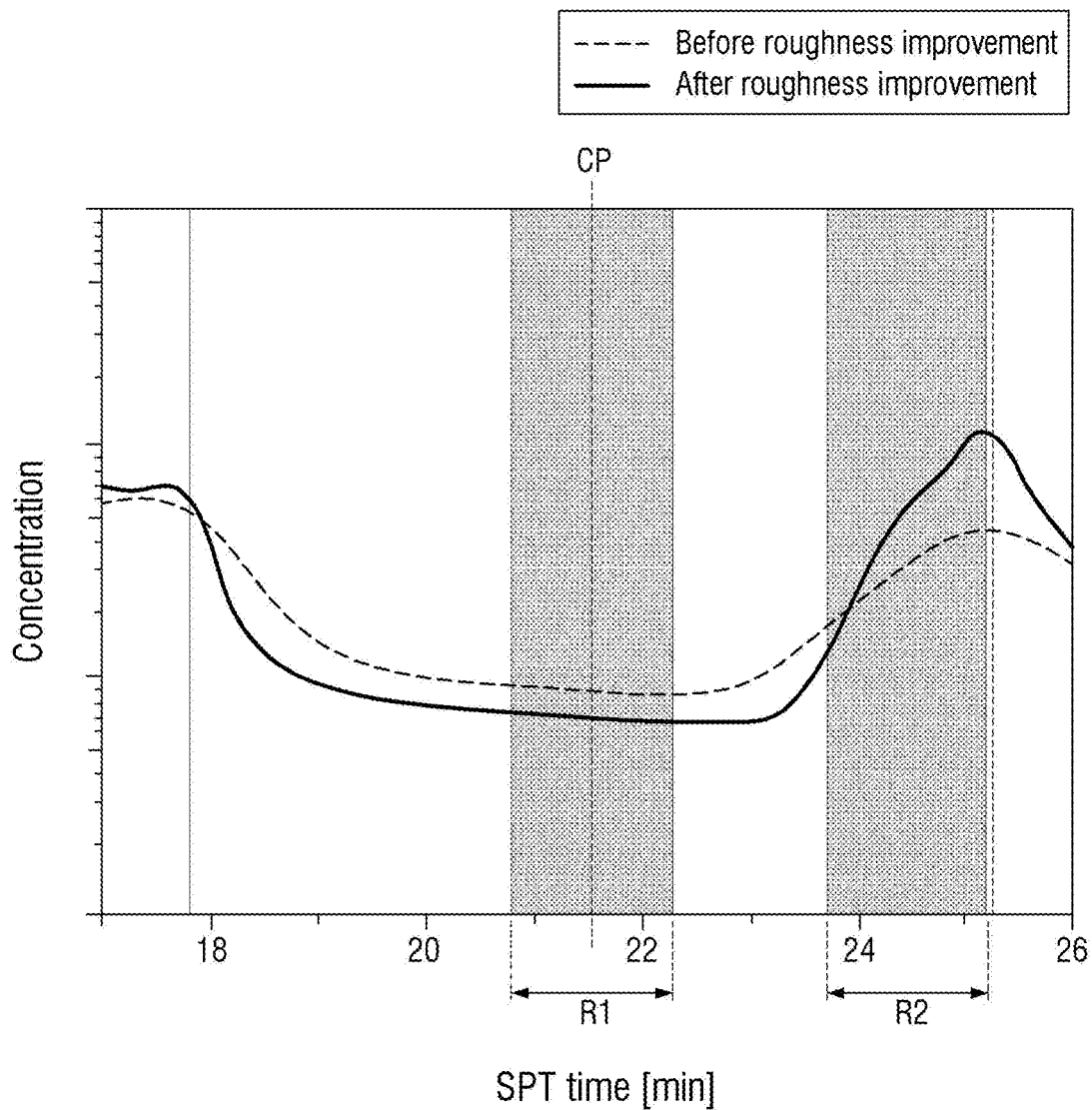
Figure 11:
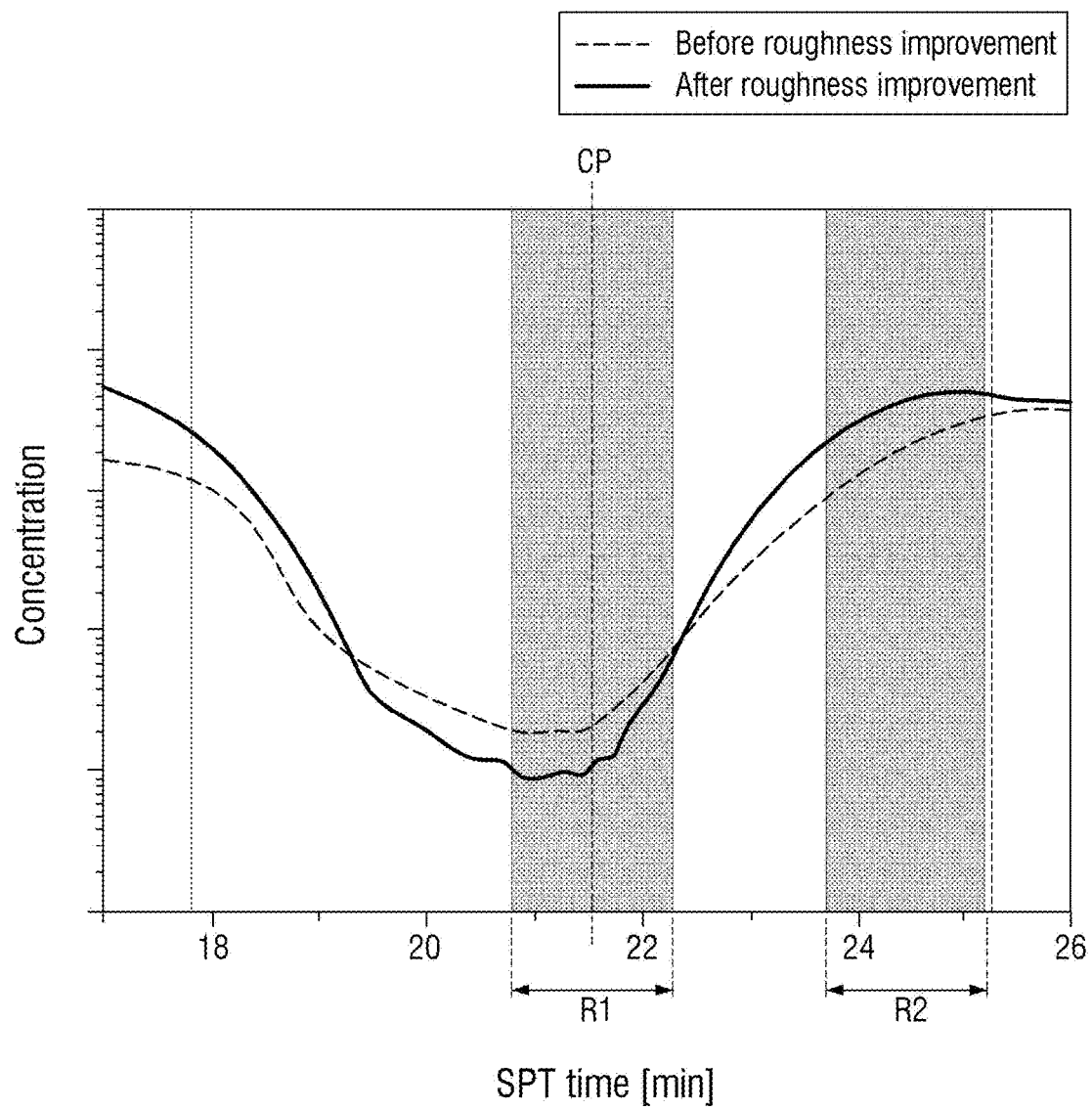

FIGS. 9 to 11 are graphs illustrating the concentration distribution of hydrogen ions in the polycrystalline silicon film, FIG. 12 is a table showing the hydrogen ion concentration areas inside the polycrystalline silicon film and at the interface of the polycrystalline silicon film with the second buffer film, and FIG. 13 is a table showing the hydrogen ion concentrations inside the polycrystalline silicon film and at the interface of the polycrystalline silicon film with the second buffer film In FIGS. 9 to 11, the X-axis indicates sputtering SPT time [min] which is a depth from the gate insulating film 120 to the second buffer film 103 in a thickness direction, and the Y-axis indicates the concentration of hydrogen ions at the corresponding depth. For example, the X-axis may refer to a depth from the other surface 131S2 of the polycrystalline silicon film 131 to the one surface 131S1 of the polycrystalline silicon film 131.

FIGS. 9 to 11 shows the concentrations of hydrogen ions to depth over time in the polycrystalline silicon film 131 (the roughness of the one surface 103a of the second buffer film 103 is 1.5 nm or less) according to an embodiment after roughness improvement and in the polycrystalline silicon film according to Comparative Example before roughness improvement. For example, FIGS. 9 to 11 show the concentration of hydrogen ions as a function of the depth from the one surface 131S2 of the polycrystalline silicon film 131 to the one surface 131S1 of the polycrystalline silicon film 131. FIG. 9 shows the concentration of hydrogen ions after deposition of the polycrystalline silicon film (after deposition of an amorphous silicon film), FIG. 10 shows the concentration of hydrogen ions after dehydrogenation (after hydrogen ions are discharged from the buffer film by the heat treatment process of the polycrystalline silicon film), and FIG. 11 shows the concentration of hydrogen ions after crystallization.

In each of the graphs of concentrations of hydrogen ions of FIGS. 9 to 11, a first region R1, and a second region R2 are defined. A first point corresponding to a depth of 50 Å in a direction from the center point CP of the amorphous silicon film or the polycrystalline silicon film toward the gate insulating film 120, and a second point corresponding to a depth of 50 Å in a direction from the center point CP of the amorphous silicon film or the polycrystalline silicon film toward the second buffer film 103 are defined. The first region R1 is defined as a section from the first point to the second point (e.g., a portion of the of the amorphous silicon film or the polycrystalline silicon film extending from the first point to the second point). As used herein, the term Å may refer to a distance equal to $10^{-10}$ meters.

The second region R2 is defined as an interface section between the amorphous silicon film or the polycrystalline silicon film and the second buffer film. The second region R2 is defined as a section. The second region R2 is defined as a section from a boundary point of the amorphous silicon film or the polycrystalline silicon film with the second buffer film to a depth of 100 Å in the direction toward the inside of the amorphous silicon film or the polycrystalline silicon film. For example, the second region R2 may be defined as a portion of the amorphous silicon film or the polycrystalline silicon film extending from the boundary between the amorphous silicon film or the polycrystalline silicon film and the second buffer film toward the gate insulating film 120 by a depth of 100 Å.

Referring to FIGS. 9 to 13, hydrogen ions may be distributed throughout the amorphous silicon film or the polycrystalline silicon film after deposition of the polycrystalline silicon film, after dehydrogenation thereof, and after crystallization thereof.

The sum of the hydrogen ion concentrations (e.g., the average concentration) in the second region R2 of the polycrystalline silicon film 131 according to an embodiment may be 100 times or more the sum of the hydrogen ion concentrations in the first region R1 thereof. As used herein, a sum of the hydrogen ion concentrations in a stated region may, for example, refer to the average hydrogen ion concentration in the state region.

Moreover, the concentration of hydrogen ions at the boundary point of the polycrystalline silicon film 131 (e.g., the boundary point of the polycrystalline silicon film with the second buffer film 103) according to an embodiment may be 200 times or more the concentration of hydrogen ions at the center point CP of the polycrystalline silicon film 131. As used herein, a hydrogen concentration at a stated point may, for example, refer to the average hydrogen ion concentration within a small or infinitesimal region near or around the stated point.

First, as shown in FIGS. 9 and 12, when the amorphous silicon film is deposited on one surface of the second buffer film, it was found that the total hydrogen ion concentration (e.g., the sum of the hydrogen ion concentrations) in the second region R2 of the amorphous silicon film according to Comparative Example before roughness improvement of the second buffer film was 1.5 times larger than the total hydrogen ion concentration (e.g., the sum of the hydrogen ion concentrations) in the first region R1 thereof.

Further, it was found that the total hydrogen ion concentration (e.g., the sum of the hydrogen ion concentrations) in the second region R2 of the amorphous silicon according to an embodiment after roughness improvement of the second buffer film was 2 times larger than the total hydrogen ion concentration (e.g., the sum of the hydrogen ion concentrations) in the first region R1 thereof.

Referring to FIGS. 9 and 13, it was found that the concentration of hydrogen ions at the boundary point of the amorphous silicon film according to Comparative Example before roughness improvement of the second buffer film was 1.8 times greater than the concentration of the hydrogen ions at the center point CP thereof.

Further, it was found that the concentration of hydrogen ions at the boundary point of the amorphous silicon film according to an embodiment after roughness improvement of the second buffer film was 3.9 times greater than the concentration of hydrogen ions at the center point CP thereof.

Thus, it may be found that the sum of hydrogen ion concentrations in the second region R2 of the amorphous silicon film according to an embodiment is much larger than the sum of hydrogen ion concentrations in the second region R2 of the amorphous silicon film according to Comparative Example. This difference may also be found in the first regions R1. Moreover, it may be found that even at example points (e.g., a boundary point) in each of the regions R1 and R2, the concentration of hydrogen ions of the amorphous silicon film according to an embodiment is greater than the concentration of hydrogen ions of the amorphous silicon according to Comparative Example. As described above, the amorphous silicon film is deposited on the one surface 103a of the second buffer film 103 having a uniform first roughness of 1.5 nm or less to form precise amorphous silicon, whereas the amorphous silicon film according to Comparative Example is deposited on one surface of the second buffer film before roughness improvement to form a plurality of pinholes, so that the sum of hydrogen ion concentrations in each of the regions R1 and R2, and at an example point (e.g., center point CP or boundary point), of the amorphous silicon film according to Comparative Example may be smaller than that of the amorphous silicon film according to an embodiment.

Next, as shown in FIGS. 10 and 12, when the polycrystalline silicon film is dehydrogenated in the heat treatment process of the polycrystalline silicon film, it was found that the sum of hydrogen ion concentrations in the second region R2 of the amorphous silicon film (polycrystalline silicon film or mixture of amorphous silicon film and polycrystalline silicon film) according to Comparative Example before roughness improvement of the second buffer film was 3.5 times than the sum of hydrogen ion concentrations in the first region R1 thereof.

Further, when the polycrystalline silicon film is dehydrogenated in the heat treatment process of the polycrystalline silicon film, it was found that the sum of hydrogen ion concentrations in the second region R2 of the amorphous silicon film (polycrystalline silicon film or mixture of amorphous silicon film and polycrystalline silicon film) according to an embodiment after roughness improvement of the second buffer film was 11.3 times than the sum of hydrogen ion concentrations in the first region R1 thereof.

Further referring to FIGS. 10 and 13, it was found that the concentration of hydrogen ions at the boundary point of the amorphous silicon film (polycrystalline silicon film or mixture of amorphous silicon film and polycrystalline silicon film) according to Comparative Example before roughness improvement of the second buffer film was 4.8 times than the concentration of hydrogen ions at the center point CP thereof.

Further, it was found that the concentration of hydrogen ions at the boundary point of the amorphous silicon film (polycrystalline silicon film or mixture of amorphous silicon film and polycrystalline silicon film) according to an embodiment after roughness improvement of the second buffer film was 23.9 times than the concentration of hydrogen ions at the center point CP thereof.

Next, as shown in FIGS. 11 and 12, after the crystallization of the polycrystalline silicon film, it was found that the sum of hydrogen ions in the second region R2 of the polycrystalline silicon film according to Comparative Example before roughness improvement of the second buffer film was 76.5 times or more the sum of hydrogen ion concentrations in the first region R1 thereof.

Further, after the crystallization of the polycrystalline silicon film, it was found that the sum of hydrogen ions in the second region R2 of the polycrystalline silicon film according to an embodiment after roughness improvement of the second buffer film was 495.6 times or more the sum of hydrogen ion concentrations in the first region R1 thereof.

Further referring to FIGS. 11 and 13, it was found that the concentration of hydrogen ions at the boundary point of the polycrystalline silicon film according to Comparative Example before roughness improvement of the second buffer film was 180.8 times greater than the concentration of hydrogen ions at the center point CP thereof.

Further, it was found that the concentration of hydrogen ions at the boundary point of the polycrystalline silicon film according to an embodiment after roughness improvement of the second buffer film was 1238.0 times greater than the concentration of hydrogen ions at the center point CP thereof.

Thus, it may be found that many hydrogen ions are distributed near the interface of the polycrystalline silicon film with the second buffer film because the polycrystalline silicon film according to an embodiment has a more precise crystal structure after roughness improvement of the second buffer film, whereas many hydrogen ions are distributed near the center because the polycrystalline silicon film according to Comparative Example has a non-precise crystal structure before roughness improvement of the second buffer film. It may be found that the difference is more than five times.

The hydrogen ions distributed near an interface of the polycrystalline silicon film with the second buffer film may function to heal defects in the back channel of the polycrystalline silicon film, which is the interface of the polycrystalline silicon film with the second buffer film, thereby making the lower portion of the polycrystalline silicon film more precise.

The sum of hydrogen ion concentrations in the entire region of the polycrystalline silicon film according to an embodiment may be greater than the sum of hydrogen ion concentrations in the entire region of the polycrystalline silicon film according to Comparative Example.

As illustrated in FIG. 11, the sum of hydrogen ion concentrations in the center portion (first region R1) of the polycrystalline silicon film according to Comparative Example, and the hydrogen ion concentration at the center point CP thereof are respectively greater than the sum of hydrogen ion concentrations in the center portion (first region R1) of the polycrystalline silicon film according to an embodiment, and the hydrogen ion concentration at the center point CP thereof. However, the polycrystalline silicon film according to an embodiment has a hydrogen ion concentration that is much larger than that of Comparative Example at the interface with the second buffer film, so that the sum of the hydrogen ion concentrations may be larger than that of Comparative Example (e.g., in the second region R2). For example, because the total hydrogen ion concentration (e.g., the sum of hydrogen ion concentrations) in the polycrystalline silicon film according to an embodiment is larger than that of the polycrystalline silicon film according to Comparative Example, the polycrystalline silicon film according to an embodiment is better than the polycrystalline silicon film according to Comparative Example in the defect healing function of hydrogen ions, and thus device characteristics of the first transistor may be improved.

Figure 14:
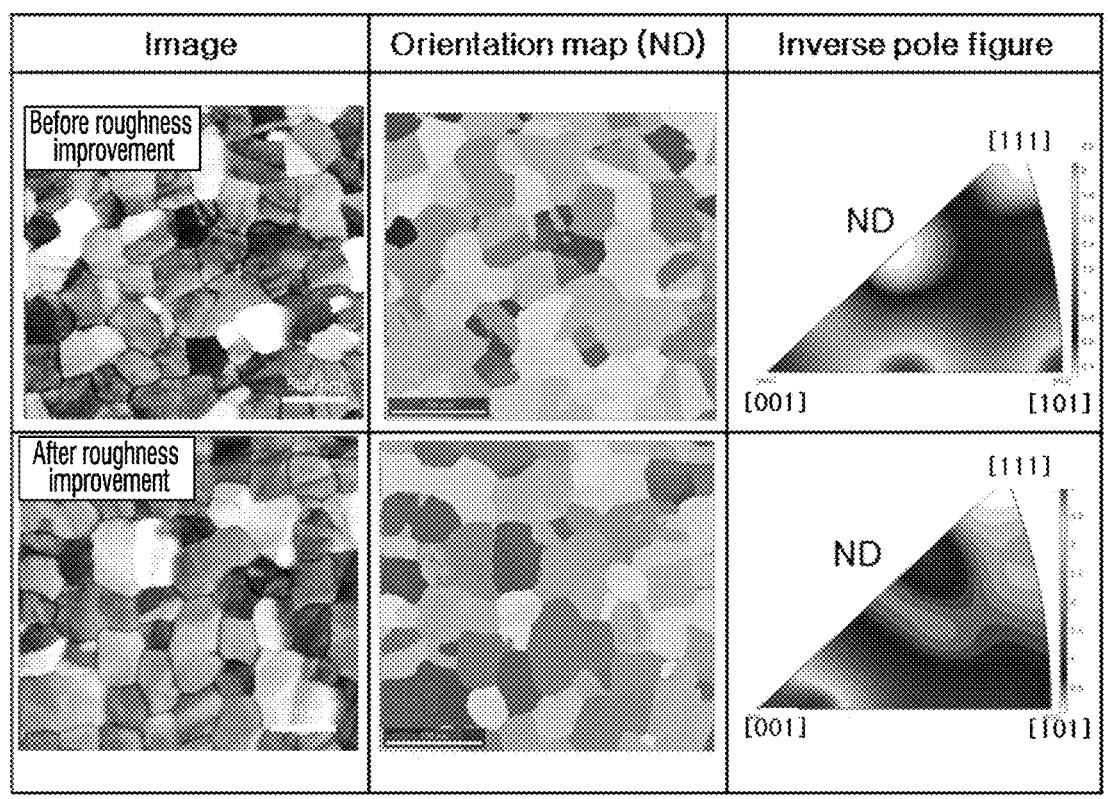
FIG. 14 is a view for comparing a polycrystalline silicon film according to an embodiment and a polycrystalline silicon film according to Comparative Example.
Figure 16:
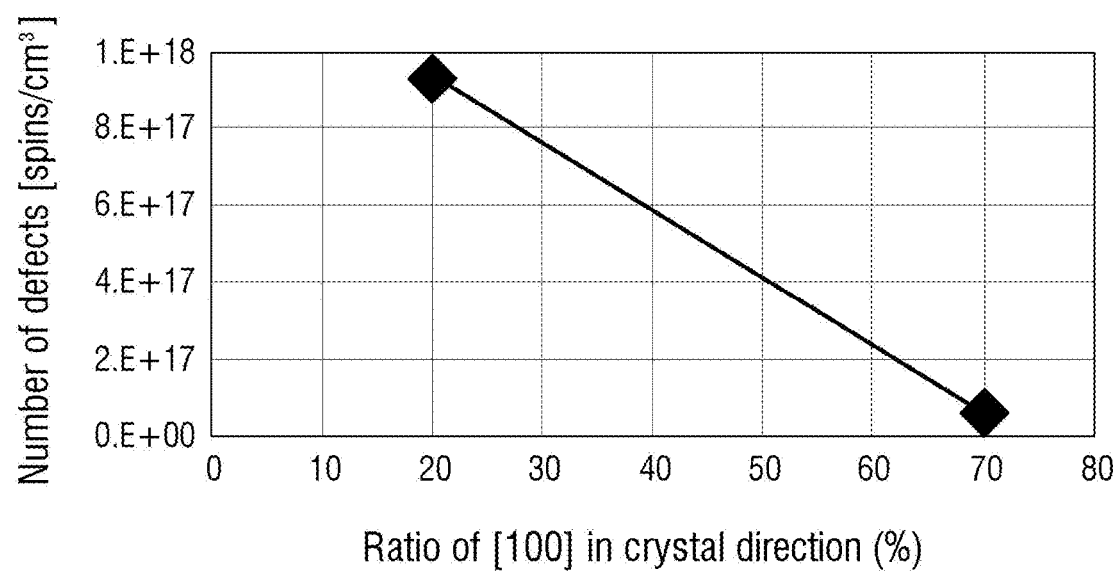
FIG. 16 is a graph illustrating the correlation between the crystal direction and defects of a polycrystalline silicon film.

FIG. 14 is a view for comparing a polycrystalline silicon film according to an embodiment and a polycrystalline silicon film according to Comparative Example, FIG. 15 is another view for comparing a polycrystalline silicon film according to an embodiment and a polycrystalline silicon film according to Comparative Example, and FIG. 16 is a graph illustrating the correlation between the crystal direction and defects of a polycrystalline silicon film. The X-axis of FIG. 16 indicates a ratio of the first crystals (e.g., a ratio of the number of first crystals) to the sum of the first crystals (e.g., the number of the first crystals), the second crystals (e.g., the number of the second crystals), and the third crystals (e.g., the number of the third crystals), and the Y-axis indicates the number of defects of the polycrystalline silicon film 131 at the ratio of the first crystals.

Referring to FIGS. 14 to 16, the main crystals of the polycrystalline silicon film 131 according to an embodiment are first crystals having a {100} plane direction ([001] crystal direction), and the number of first crystals may be about 20% or more of the total number of crystals. Moreover, the number of first crystals may be about 70% or more of the sum of the number of first crystals, the number of second crystals having a {101} plane direction, and the number of third crystals having a {111} plane direction.

Moreover, the average size of crystals of the polycrystalline silicon film 131 according to an embodiment may be about 350 nm or more, about 370 nm or more, or about 396 nm or more. Thus, the average size of crystals of the polycrystalline silicon film 131 according to an embodiment may be greater than the average size of crystals of the polycrystalline silicon film 131 according to Comparative Example, and the size uniformity of crystals of the polycrystalline silicon film 131 according to an embodiment may be better (e.g., more excellent) than the size uniformity of crystals of the polycrystalline silicon film 131 according to Comparative Example.

As shown in FIG. 15, it was found that in the polycrystalline silicon film 131 according to Comparative Example, the ratio of the first crystals to the total crystals is 4.48%, the ratio of the second crystals to the total crystals is 16.06%, and the ratio of the third crystals to the total crystals is 1.43%. It was also found that in the polycrystalline silicon film 131 according to an embodiment, the ratio of the first crystals to the total crystals is 21.20%, the ratio of the second crystals to the total crystals is 8.59%, and the ratio of the third crystals to the total crystals is 0.24%. For example, it may be found that the polycrystalline silicon film 131 according to an embodiment has a large (e.g., greater) ratio of first crystals to the total crystals as compared with the polycrystalline silicon film according to Comparative Example.

As shown in FIG. 16, it may be found that as the ratio of the first crystals to the group of the first crystals, the second crystals, and the third crystals in the polycrystalline silicon film 131 increases, the number of defects in the polycrystalline silicon film 131 decreases. In an embodiment, when the ratio of the first crystals to the group is 20%, the number of defects may be in a range of about $8\times10^{17}$ (spins/cm$^3$) to about $1\times10^{18}$ (spins/cm$^3$), whereas when the ratio of the first crystals to the group is 70%, the number of defects may be in a range of about $2\times10^{17}$ (spins/cm$^3$) or less. For example, when the ratio of the first crystals in the group is 70%, the number of defects may be $1\times10^{17}$ (spins/cm$^3$) or less.

Figure 17:
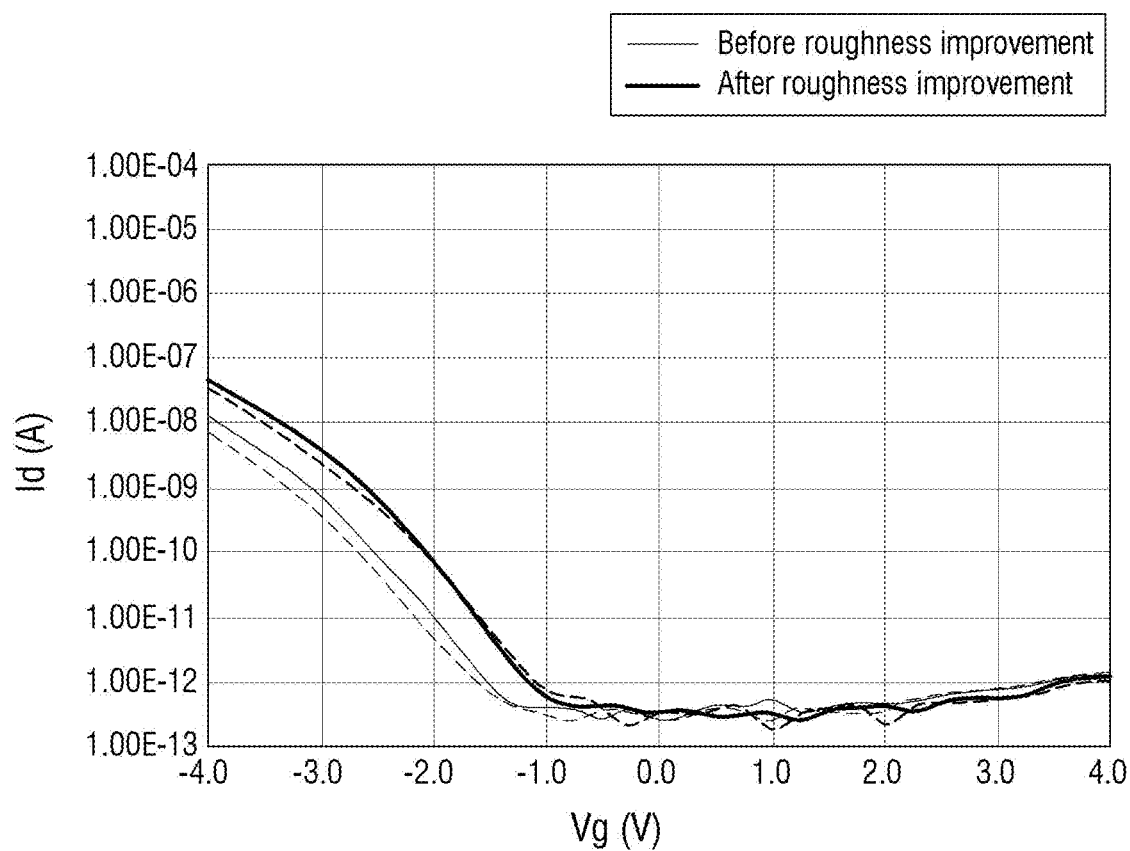
FIG. 17 is a graph illustrating an improvement in the hysteresis of a first transistor according to an embodiment.
Figure 18:
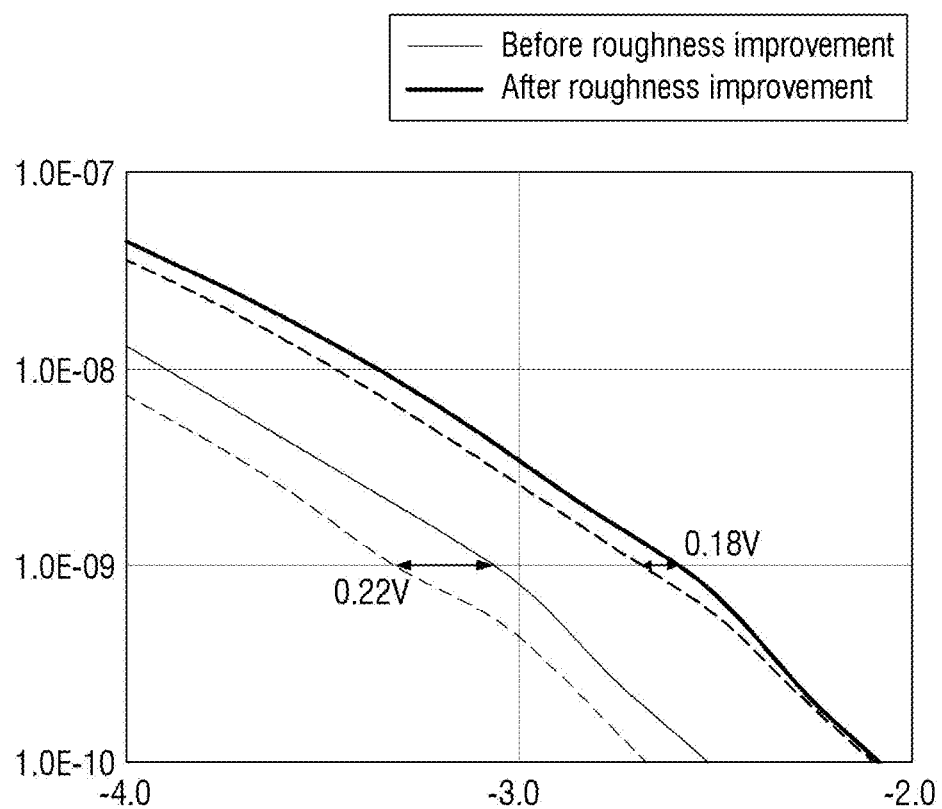
FIG. 18 is an enlarged graph of a portion of FIG. 17.

FIG. 17 is a graph illustrating an improvement in the hysteresis of a first transistor according to an embodiment, and FIG. 18 is an enlarged graph of a portion of FIG. 17. FIGS. 17 and 18 compare a driving current Id (A) with respect to a driving voltage Vg (V) of the first transistor T1 of the display device 10 including the roughened second buffer film 103 (e.g., after the roughness improvement of the second buffer film 103) and the polycrystalline silicon film 131 according to an embodiment with a driving current Id (A) with respect to a driving voltage Vg (V) of the first transistor T1 of the display device 10 including the second buffer film and the polycrystalline silicon film before the roughness improvement according to Comparative Example.

In the present specification, the hysteresis of the first transistor means that a difference in driving voltage Vg (V) at the same driving current Id (A) between the positive behavior (behavior from turn off to turn on, forward swing) of the first transistor T1 and the reverse behavior (behavior from turn on to turn off, reverse swing) of the first transistor T1 occurs.

Referring to FIGS. 17 and 18, it may be found that, based on the driving current Id of $1 \times 10^{-9}$ A, the driving voltage Vg in the positive behavior of the first transistor T1 of the display device 10 is different from the driving voltage Vg in the reverse behavior thereof by 0.18 V. It may further be found that the driving voltage Vg in the positive behavior of the first transistor of the display device according to Comparative Example is different from the driving voltage Vg in the reverse behavior thereof by 0.22V. For example, it may be found that, in the first transistor T1 according to an embodiment, the hysteresis of a device is reduced (e.g., is less than) compared to in the first transistor according to Comparative Example.

Figure 19:
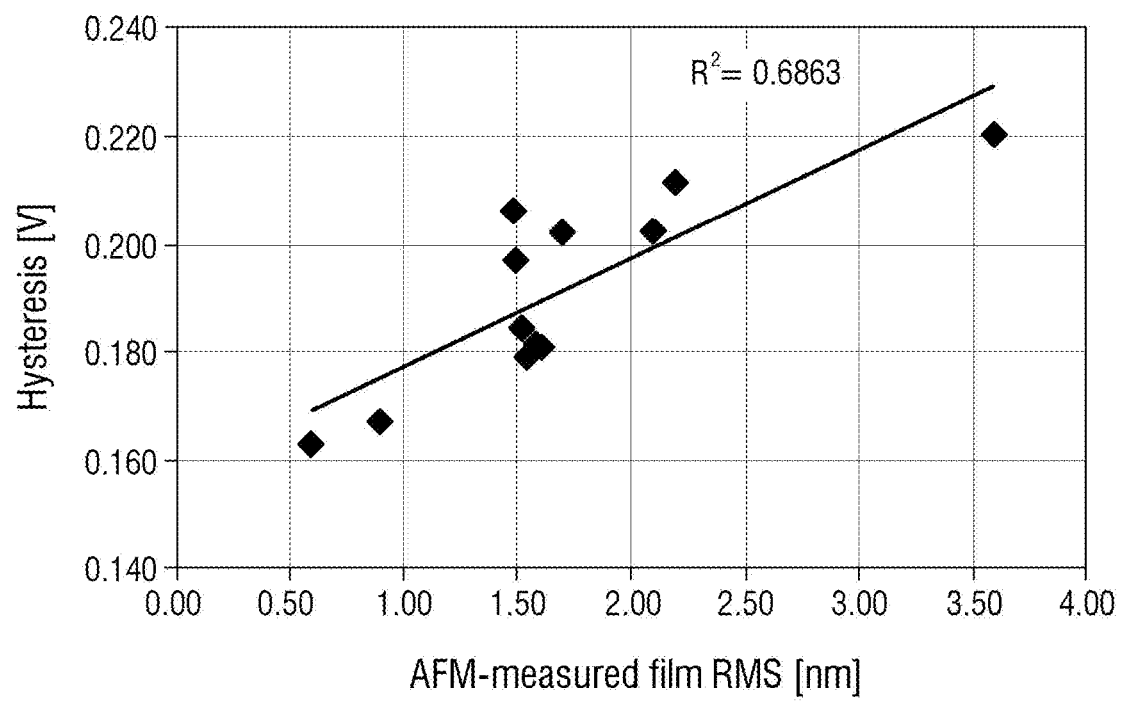
FIG. 19 is a graph illustrating the correlation between the roughness and hysteresis degree of a second buffer film.
Figure 20:
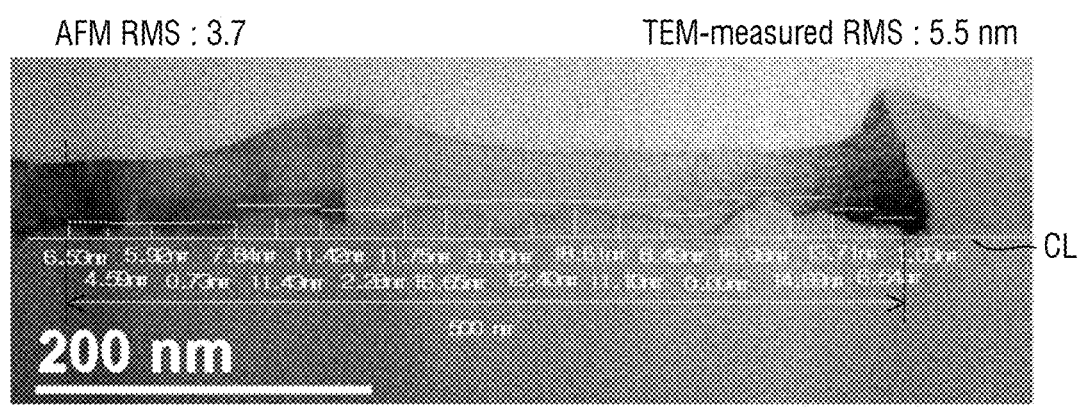
FIG. 20 is a photograph showing a second buffer film and a polycrystalline silicon film of Comparative Example.

FIG. 19 is a graph illustrating the correlation between the roughness and hysteresis degree of a second buffer film, and FIG. 20 is a photograph showing a second buffer film and a polycrystalline silicon film of Comparative Example. FIG. 20 shows that the roughness of the one surface of the second buffer film was measured utilizing an atomic force microscopy (AFM).

Referring to FIGS. 19 and 20, there is a correlation between the first roughness of the one surface 103a of the second buffer film 103 and the degree of hysteresis thereof. For example, it may be found that the first roughness of the one surface 103a of the second buffer film 103 is proportional to the degree of hysteresis thereof with a correlation of $R^2 = 0.6863$. As used herein, the term $R^2$ may, for example, refer to the coefficient of determination of a set of data.

FIG. 20 relates to Comparative Example in which the first roughness of one surface of the second buffer film is about 3.7 nm (RMS) when measured by an atomic microscope (atomic force microscopy (AFM)), and the roughness thereof is about 5.5 nm (RMS) when measured by a transmission electron microscope. As shown in FIG. 18, it may be found that the hysteresis degree of the first transistor according to Comparative Example is about 0.22 V at the driving current Id of about $1 \times 10^{-9}$ A. In contrast, it may be found that the hysteresis degree of the first transistor T1 according to an embodiment in which the first roughness of the one surface 103a of the second buffer film 103 is about 1.5 nm or less (measured by an atomic microscope) and about 1.9 nm or less (measured by a transmission electron microscope) is about 0.18 V at the driving current Id of about $1 \times 10^{-9}$ A. Therefore, it may be found that the hysteresis degree of the first transistor T1 according to an embodiment is reduced by (e.g., is less than) about 0.04 V as compared with the hysteresis degree of the first transistor according to Comparative Example.

Hereinafter, a method of manufacturing the second buffer film 103 for forming (e.g., improving) the roughness of the one surface 103a of the second buffer film 103 at the aforementioned level of 1.5 nm or less (measured by an atomic microscope) or 1.9 nm or less (measured by a transmission electron microscope) will be described.

Figure 21:
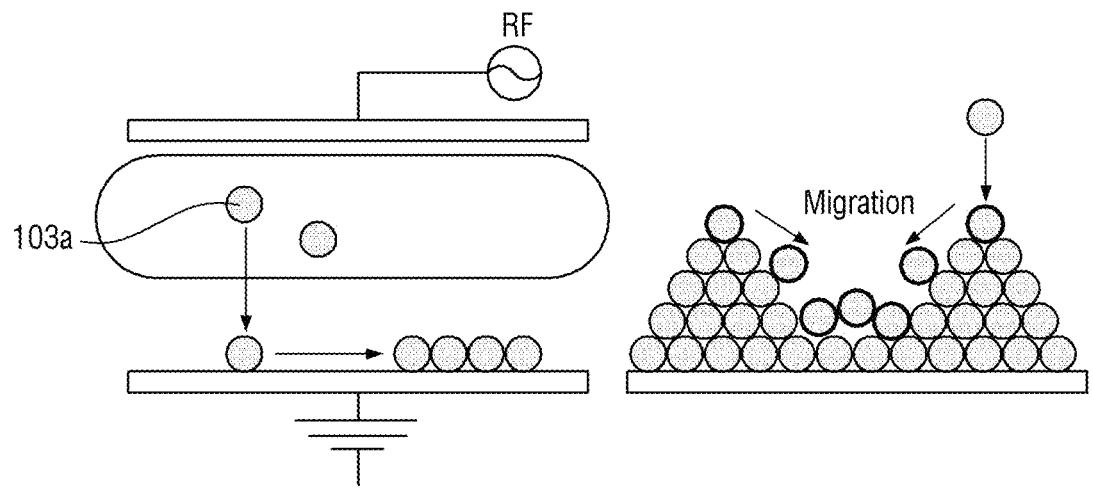
FIG. 21 is a view schematically illustrating a process of manufacturing a second buffer film according to an embodiment.
Figure 22:
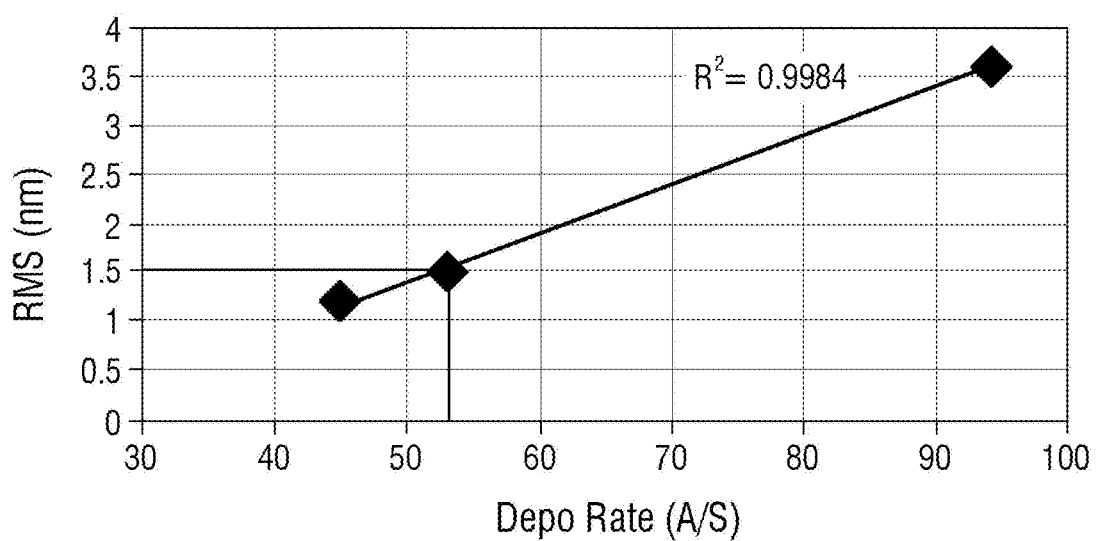
FIG. 22 is a graph illustrating the correlation between the deposition rate and roughness of a second buffer film.

FIG. 21 is a view schematically illustrating a process of manufacturing a second buffer film according to an embodiment, and FIG. 22 is a graph illustrating the correlation between the deposition rate and roughness of a second buffer film.

Referring to FIGS. 21 and 22, the second buffer film 103 according to an embodiment is formed through plasma enhanced chemical vapor deposition (PECVD).

The first roughness of the second buffer film 103 having a level of 1.5 nm or less (measured by an atomic microscope) or 1.9 nm or less (measured by transmission electron microscope) may be formed by increasing the dissociation force of a first reaction gas and a second reaction gas which are materials of (e.g., which include materials included in) the second buffer film 103. For example, the first reaction gas is silane ($SiH_4$), and the second reaction gas is nitrogen oxide ($N_xO$), but the present disclosure is not limited thereto. The first reaction gas and the second reaction gas react with each other to obtain (e.g., to form) a product 103a.

In order to increase the dissociation force of the first reaction gas and the second reaction gas, it may be considered to decrease the deposition rate of the product 103a (or second buffer film material, for example, $SiO_2$) obtained by reacting the first reaction gas with the second reaction gas. For example, when decreasing the deposition rate of the product, the ratio of incomplete dissociation structures of the first reaction gas and the second reaction gas decreases, many dissociation structures of Si from the first reaction gas and many dissociation structures of O from the second reaction gas may be generated.

As shown in FIG. 22, in the process of forming the second buffer film having a first roughness of 1.5 nm or more according to an embodiment, the deposition rate of the product may be 60 A/s (Å/s) or less, and preferably 55 A/s (Å/s) or less.

The deposition rate of the product may be controlled by the flow rate of the reaction gases, the power of plasma, and/or the condition of chamber pressure. In order to form the second buffer film according to an embodiment in which the deposition rate of the product is 60 A/s (Å/s) or less, and preferably 55 A/s (Å/s) or less, it may be considered to decrease the flow rate of the reaction gases (e.g., to decrease the flow rate of one or more of the reaction gases), increase the power of plasma, and/or lower the pressure of a chamber. In order to form the second buffer film according to an embodiment, all three factors of a reaction gas increase control (e.g., to decrease the flow rate of one or more of the reaction gases), a plasma power increase, and a chamber pressure decrease may be considered, or one or more of the three factors may be considered (e.g., any combination of the three factors may be considered).

For example, in some embodiments, the rate of flow rate of the first reaction gas and the second reaction gas may be set to 1:20 or more. In some embodiments, the ratio of flow rates of the first reaction gas to the second reaction gas may be set to 1:20 or more.

In some embodiments, the plasma power may be increased to 6 kW or more.

In some embodiments the chamber pressure may be reduced to 1200 Torr or less.

According to the display device of embodiments, device characteristics of thin film transistors can be improved.

The aspects and features of the present disclosure are not limited by or to the foregoing, and other various aspects and features are anticipated and included herein.

Although the disclosed embodiments of the present disclosure have been described for illustrative purposes, those skilled in the art will appreciate that various suitable modifications, additions and substitutions are possible, without departing from the scope and spirit of the present disclosure as disclosed in the accompanying claims and equivalents thereof.

What is claimed is:

1. A display device, comprising:
a substrate;
a polycrystalline silicon film on the substrate; and
a first buffer film between the substrate and the polycrystalline silicon film and having one surface contacting the polycrystalline silicon film and another surface opposite to the one surface,
wherein the one surface of the first buffer film has a first root mean square (RMS) roughness range, and the first RMS roughness range is 1.5 nm or less.

2. The display device of claim 1,
wherein the first buffer film includes a silicon oxide film.

3. The display device of claim 2, further comprising:
a second buffer film between the substrate and the first buffer film,
wherein the second buffer film includes a different material than the first buffer film.

4. The display device of claim 3,
wherein the second buffer film includes a silicon nitride film.

5. The display device of claim 1,
wherein the polycrystalline silicon film has one surface contacting the one surface of the first buffer film, and another surface opposite to the one surface of the polycrystalline silicon film, and
wherein the one surface of the polycrystalline silicon film has a second RMS roughness range, and the second RMS roughness range is equal to the first RMS roughness range.

6. The display device of claim 5,
wherein the other surface of the polycrystalline silicon film has a third RMS roughness range, and the third RMS roughness range is greater than the second RMS roughness range.

7. The display device of claim 1,
wherein the polycrystalline silicon film has one surface contacting the one surface of the first buffer film, and another surface opposite to the one surface of the polycrystalline silicon film, and
wherein the polycrystalline silicon film includes hydrogen ions, and an average concentration of the hydrogen ions in a vicinity of the one surface of the polycrystalline silicon film is greater than an average concentration of the hydrogen ions in a vicinity of a center of the polycrystalline silicon film.

8. The display device of claim 7,
wherein the vicinity of the one surface of the polycrystalline silicon film is defined as a first region which is a section of the polycrystalline silicon film extending from the one surface of the polycrystalline silicon film toward the other surface of the polycrystalline silicon film by a depth of 100 Å, and
wherein the vicinity of the center of the polycrystalline silicon film is defined as a second region which is a section of the polycrystalline silicon film extending from a center point of the polycrystalline silicon film toward the one surface of the polycrystalline silicon film by a depth of 50 Å, and extending from the center point of the polycrystalline silicon film toward the other surface of the polycrystalline silicon film by a depth of 50 Å.

9. The display device of claim 8,
wherein an average concentration of the hydrogen ions in the first region is 100 times or more an average concentration of the hydrogen ions in the second region.

10. The display device of claim 9,
wherein the hydrogen ions of the polycrystalline silicon film are provided from the first buffer film.

11. The display device of claim 7,
wherein a concentration of the hydrogen ions at the one surface of the polycrystalline silicon film is 200 times or more a concentration of the hydrogen ions at the center of the polycrystalline silicon film.

12. The display device of claim 1,
wherein, among crystals of the polycrystalline silicon film, a ratio of the number of first crystals having a {100} plane to the number of all crystals is 20% or more.

13. The display device of claim 12,
wherein, among the crystals of the polycrystalline silicon film, a ratio of the number of the first crystals to the sum of the number of the first crystals, the number of second crystals having a {101} plane, and the number of third crystals having a {111} plane is 70% or more.

14. The display device of claim 13,
wherein the polycrystalline silicon film has an average crystal size of 350 nm.

15. The display device of claim 14,
wherein the number of defects in the polycrystalline silicon film is $1 \times 10^{17}$ (spins/cm$^3$).

16. The display device of claim 1,
wherein the first RMS roughness range is calculated by measuring 20 points spaced apart at 25 nm regulars in a region having a length of 500 nm, and
the first RMS roughness range is measured utilizing an atomic microscope or TEM.

17. A display device, comprising:
a substrate;
a polycrystalline silicon film on the substrate; and
a first buffer film between the substrate and the polycrystalline silicon film and having one surface contacting the polycrystalline silicon film and another surface opposite to the one surface,
wherein the one surface of the first buffer film has a first root mean square (RMS) roughness range, and the first RMS roughness range is 1.5 nm or less, and
wherein, among crystals of the polycrystalline silicon film, a ratio of the number of first crystals having a {100} plane direction to the number of all crystals is 20% or more.

18. The display device of claim 17,
wherein the first RMS roughness range is calculated by measuring 20 points spaced apart at 25 nm regulars in a region having a length of 500 nm, and
wherein the first RMS roughness range is measured utilizing an atomic microscope.

19. The display device of claim 18,
wherein the polycrystalline silicon film has one surface contacting the one surface of the first buffer film, and another surface opposite to the one surface of the polycrystalline silicon film,
wherein the one surface of the polycrystalline silicon film has a second RMS roughness range,
wherein the second RMS roughness range is equal to the first RMS roughness range,
wherein the other surface of the polycrystalline silicon film has a third RMS roughness range, and wherein the third RMS roughness range is greater than the second RMS roughness range.

20. The display device of claim 18, wherein, among the crystals of the polycrystalline silicon film, a ratio of the number of the first crystals to the sum of the number of the first crystals, the number of second crystals having a {101} plane direction, and the number of third crystals having a {111} plane direction is 70% or more.

* * * * *